(12) United States Patent
Fujisawa

(10) Patent No.: US 9,570,119 B2
(45) Date of Patent: Feb. 14, 2017

(54) INFORMATION PROCESSING SYSTEM INCLUDING SEMICONDUCTOR DEVICE HAVING SELF-REFRESH MODE

(71) Applicant: PS4 LUXCO S.A.R.L., Luxembourg (LU)

(72) Inventor: Hiroki Fujisawa, Tokyo (JP)

(73) Assignee: LONGITUDE SEMICONDUCTOR S.A.R.L., Luxembourg (LU)

( * ) Notice: Subject to any disclaimer, the term of this patent is extended or adjusted under 35 U.S.C. 154(b) by 0 days.

(21) Appl. No.: 14/451,018

(22) Filed: Aug. 4, 2014

(65) Prior Publication Data

US 2014/0340976 A1  Nov. 20, 2014

Related U.S. Application Data

(63) Continuation of application No. 13/559,439, filed on Jul. 26, 2012, now Pat. No. 8,817,558.

(30) Foreign Application Priority Data

Jul. 28, 2011  (JP) ................. 2011-165714

(51) Int. Cl.
*G11C 7/04* (2006.01)
*G11C 11/406* (2006.01)
(Continued)

(52) U.S. Cl.
CPC . *G11C 7/04* (2013.01); *G11C 7/22* (2013.01); *G11C 11/4093* (2013.01);
(Continued)

(58) Field of Classification Search
CPC ....... G11C 7/04; G11C 7/1045; G11C 7/1048; G11C 7/1051; G11C 11/4093; G11C 11/406; G11C 11/40603; G11C 11/40626; G11C 7/1069; G11C 7/22; G11C 7/222; G11C 7/1066; G06F 3/067; G06F 3/0605; G06F 3/0659; G06F 3/06
(Continued)

(56) References Cited

U.S. PATENT DOCUMENTS 7,057,397 B1 * 6/2006 Davidson et al. ............ 324/606
7,372,294 B2 * 5/2008 Kim .............................. 326/30
(Continued)

OTHER PUBLICATIONS

Fujisawa, H.; Kubouchi, S.; Kuroki, K.; Nishioka, N.; Riho, Y.; Noda, H.; Fujii, I.; Yoko, H.; Takishita, R.; Ito, T.; Tanaka, H.; Nakamura, M. "An 8.1-ns Column-Access 1.6-Gb/s/pin DDR3 SDRAM With an 8:4 Multiplexed Data-Transfer Scheme", Solid-State Circuits, IEEE Journal of, Issue Date: Jan. 2007.*

*Primary Examiner* — Richard Elms
*Assistant Examiner* — Ajay Ojha
(74) *Attorney, Agent, or Firm* — Kunzler Law Group, PC

(57) ABSTRACT

A method for controlling termination impedance of a data terminal in a dynamic random access memory device includes receiving a mode register set command to set an operation mode to a first mode, setting the operation mode in a mode register to the first mode, receiving a self-refresh entry command, entering self-refresh mode, activating a first input buffer connected to a termination impedance control terminal, and receiving an impedance control signal at the first buffer, wherein the termination impedance of the data terminal is set to a first impedance value if the termination impedance control signal has a first level and the termination impedance of the data terminal is set to a second impedance value if the termination impedance control signal has a second level.

9 Claims, 26 Drawing Sheets

(51) Int. Cl.
*G11C 11/4093* (2006.01)
*G11C 7/22* (2006.01)
*G06F 13/16* (2006.01)

(52) U.S. Cl.
CPC .... *G11C 11/40615* (2013.01); *G06F 13/1636* (2013.01); *G11C 7/222* (2013.01); *G11C 2211/4067* (2013.01)

(58) Field of Classification Search
USPC ....... 365/212, 230.06, 230.08; 711/106, 154; 713/322
See application file for complete search history.

(56) References Cited

U.S. PATENT DOCUMENTS

| | | | |
|---|---|---|---|
| 7,733,731 B2* | 6/2010 | Ito et al. | 365/222 |
| 2005/0002223 A1* | 1/2005 | Coteus et al. | 365/154 |
| 2007/0297260 A1* | 12/2007 | Lee et al. | 365/222 |

* cited by examiner

| SYMBOL | CKE PRIOR CYCLE | CKE CURRENT CYCLE | CSB | FASB | CASB | WEB |
|---|---|---|---|---|---|---|
| REF | H | H | L | L | L | H |
| SRE | H | L | L | L | L | H |
| SRX | L | H | H | — | — | — |
| PDE | H | L | L | H | H | H |
| PDX | L | H | H | — | — | — |

FIG.4

| DIMM401 | | DIMM402 | |
|---|---|---|---|
| RANK1 | RANK2 | RANK1 | RANK2 |
| 120 Ω | ODT off | ODT off | 30 Ω |

FIG.27A

| DIMM401 | | DIMM402 | |
|---|---|---|---|
| RANK1 | RANK2 | RANK1 | RANK2 |
| ODT off | 30 Ω | 120 Ω | ODT off |

FIG.27B

| DIMM401 | | DIMM402 | |
|---|---|---|---|
| RANK1 | RANK2 | RANK1 | RANK2 |
| ODT off | ODT off | ODT off | 30 Ω |

FIG.27C

| DIMM401 | | DIMM402 | |
|---|---|---|---|
| RANK1 | RANK2 | RANK1 | RANK2 |
| ODT off | 30 Ω | ODT off | ODT off |

FIG.27D

INFORMATION PROCESSING SYSTEM INCLUDING SEMICONDUCTOR DEVICE HAVING SELF-REFRESH MODE

The present application is a Continuation Application of U.S. patent application Ser. No. 13/559,439 filed on Jul. 26, 2012, which is based on and claims priority from Japanese Patent Application No. 2011-165714, filed on Jul. 28, 2011, the entire contents of which are incorporated herein by reference.

BACKGROUND OF THE INVENTION

Field of the Invention

The present invention relates to an information Processing system and a control method thereof, and more particularly to an information processing system including a semiconductor device with a self-refresh mode and a control method thereof. The present invention also relates to a control method of a controller, and more particularly to a controller that controls a semiconductor device with a self-refresh mode and a control method thereof.

Description of Related Art

An operation mode called a self-refresh mode is provided for the DRAM. The self-refresh mode is a kind of standby mode in which refresh of storage data included in storage cells is periodically performed inside of the DRAM in asynchronism with outside. A controller can stop issuance of many external signals such as an external clock signal and a command signal to be supplied to the semiconductor device, during a period when the semiconductor device has entered the self-refresh mode. During the period when the semiconductor device has entered the self-refresh mode, an input first-stage circuit such as a clock receiver included in the DRAM to receive a signal supplied from outside is inactivated and operations of circuit blocks such as the DLL, circuit are also stopped. Accordingly, when the semiconductor device has entered the self-refresh mode, entire power consumption of the system becomes quite low. Furthermore, the refresh operation is periodically performed inside of the DRAM, so that the storage data are not lost.

On the other hand, the DRAM often has a function called ODT (On Die Termination). The ODT function enables a data terminal included in the DRAM to be used as a termination resistor. When the DRAM with the ODT function is used, signal quality of read data and write data can be enhanced without using an external termination resistor outside of the semiconductor device. For example, the ODT function is dynamically controlled by an impedance control signal issued from a controller.

However, because the impedance control signal is introduced inside of the DRAM in synchronism with an external clock signal, there is a problem that the impedance control signal cannot be used during a period when the semiconductor device has entered a self-refresh mode in which an input first-stage circuit such as a clock receiver is inactivated. Japanese Patent Application Laid-open No. 2001-332086 describes a DRAM that continuously receives an external clock signal even during a period when a semiconductor device has entered a self-refresh mode.

When having entered the self-refresh mode, the controller cannot use the ODT function. When data terminals of two semiconductor devices are connected with each other and one of the semiconductor devices is set to the self-refresh mode, data cannot be read from or write into the other semiconductor device. Therefore, the controller has no alternative but to enter a power-down mode in which the ODT function can be used; however, power consumption is higher in the power-down mode than in the self-refresh mode.

As to how the DRAM described in Japanese Patent Application Laid-open No. 2001-332086 handles an impedance control signal during a period when the semiconductor device has entered the self-refresh mode is unexplained. Furthermore, because a clock receiver is always activated in the DRAM described in Japanese Patent Application Laid-open No. 2001-332086, power consumption of the clock receiver cannot be reduced even when the semiconductor device enters the self-refresh mode.

This problem occurs not only in the DRAM but also in all semiconductor devices with the ODT function or the self-refresh mode. For example, there is the same problem also in a nonvolatile memory, a controller thereof, and a system, which are required to operate at high frequency. Further, there is the same problem also in a semiconductor device that in apart includes nonvolatile memory cells having a problem of cell data retention.

SUMMARY

In one embodiment, there is provided a semiconductor device that includes: a first input buffer circuit to which an external clock signal having a predetermined frequency is supplied from outside; a DLL circuit that generates an internal clock signal that is phase-controlled based on an output signal from the first input buffer circuit; a memory cell array that has a plurality of memory cells requiring an refresh operation in order to retain of storage data therein; an output buffer circuit that outputs the storage data read from the memory cell array to outside through a data terminal synchronously with the internal clock signal; a second input buffer circuit supplied with an impedance control command from outside; and an access control circuit. The access control circuit enters a self-refresh mode in which the refresh operation is performed in response to a self-refresh command, performs the refresh operation in response to an auto-refresh command, exits the self-refresh mode in response to a self-refresh exit command, and controls an impedance of the data terminal in response to the impedance control command during the self-refresh mode.

In another embodiment, there is provided a controller that includes: a command issuing unit that issues commands to a semiconductor device having a self-refresh mode in which a refresh operation of storage data in memory cell array is performed; and a data processor that processes the storage data transmitted to or received from the semiconductor device through a data terminal included therein. The command issuing unit includes: an impedance control command issuing unit that issues an impedance control command to control an impedance of the data terminal; and a sub-command issuing unit that issues a self-refresh command that causes the semiconductor device to enter the self-refresh mode, a self-refresh exit command that causes the semiconductor device to exit the self-refresh mode, and an auto-refresh command that causes the semiconductor device to perform the refresh operation. The impedance control command issuing unit issues the impedance control command to the semiconductor device while the semiconductor device is in the self-refresh mode so that the semiconductor device controls an impedance of the data terminal during the self-refresh mode.

In still another embodiment, there is provided an information processing system that includes: a first device including a memory cell array that holds storage data and a data terminal through which the storage data is output, the first device performing a refresh operation of the storage data in a self-refresh mode and an auto-refresh mode; and a second device issuing a self-refresh command that causes the first device to enter the self-refresh mode, a self-refresh exit command that causes the first device to exit the self-refresh mode, an auto-refresh command that causes the first device to enter the auto-refresh mode, and an impedance control command to control an impedance of the data terminal. The second device issues the impedance control command to the first device while the first device is in the self-refresh mode. The first device controls an impedance of the data terminal in response to the impedance control command.

Instill another embodiment, there is provided a control method of an information processing system having a controller and a semiconductor device. The method includes: issuing, from the controller to the semiconductor device, a self-refresh command, a self-refresh exit command, an auto-refresh command, and an impedance control command; entering a self-refresh mode in which a refresh operation on memory cells included in a memory cell array of the semiconductor device is performed in response to the self-refresh command; exiting the self-refresh mode in response to the self-refresh exit command; performing a refresh operation on the memory cells in response to the auto-refresh command; and controlling an impedance of a data terminal through which storage data in the memory cell array is output. The controller issues the impedance control command to the semiconductor device while the semiconductor device is in the self-refresh mode.

In still another embodiment, there is provided a control method of a controller, the method including: issuing a self-refresh command that causes a semiconductor device to enter a self-refresh mode in which a refresh operation on memory cells included in a memory cell array of the semiconductor device is performed; issuing a self-refresh exit command that causes the semiconductor device to exit the self-refresh mode; issuing an auto-refresh command that causes the semiconductor device to perform the refresh operation on the memory cells; and issuing an impedance control command to control an impedance of a data terminal of the semiconductor device through which storage data in the memory cell array is output while the semiconductor device is in the self-refresh mode.

According to the present invention, an impedance of the data terminal can be controlled in response to the impedance control command even in the self-refresh mode.

BRIEF DESCRIPTION OF THE DRAWINGS

FIG. 4 is a list of commands indicated by command signals CMD and a clock enable signal CKE;

FIGS. 27A to 27D are tables for explaining impedance controls for respective ranks, in which FIG. 27A shows a case where a write operation is performed for the DIMM 401, FIG. 27B shows a case where a write operation is performed for the DIMM 402, FIG. 27C shows a case where a read operation is performed for the DIMM 401, and FIG. 27D shows a case where a read operation is performed for the DIMM 402.

DETAILED DESCRIPTION OF THE EMBODIMENTS

A representative embodiment of a technical concept for solving the problem of the present invention is described below. It is needless to mention that the contents that the present application is to claim for patent are not limited to the following technical concept, but to the description of the appended claims. That is, according to the present invention, a controller issues an impedance control signal for controlling an impedance of a data terminal even in a self-refresh mode and a semiconductor device always activates an input buffer circuit that receives the impedance control signal even in the self-refresh mode. The present invention has a technical concept of bypassing a latch circuit that latches the impedance control signal in synchronism with a clock signal in the self-refresh mode, for example. Accordingly, the impedance control signal can be input in the self-refresh mode without using the clock signal. That is, according to the present invention, the impedance of the data terminal can be controlled while an auto-refresh command is Performed (auto-refresh mode) and an impedance of the data terminal can be controlled also in the self-refresh mode. The auto-refresh and the self-refresh of the present application are the same in that refresh of storage data is performed and are different in power consumption and specifications of interface during refresh. The consumption current in the self-refresh is lower than that in the auto-refresh. This is because the controller stops an external clock as a synchronization signal (a system clock of a memory bus, also referred to as an external synchronization signal), during a large part of a self-refresh period. In the semiconductor device, more clock buffers (input buffer circuits) that communicate with outside can be inactivated at the time of self-refresh, so that power of internal circuits not related to refresh in the semiconductor device can be controlled to be smallest. From the viewpoint of interface, impedance controls of the data terminal through which data are output are different, for example. The impedance control is performed in asynchronism with the external clock signal during the self-refresh and the impedance control is performed in synchronism with the external clock signal during the auto-refresh. Accordingly, the consumption current during the self-refresh is lower than that during the auto-refresh at least by power consumption of the clock receiver that receives the external clock signal.

Figure 1:
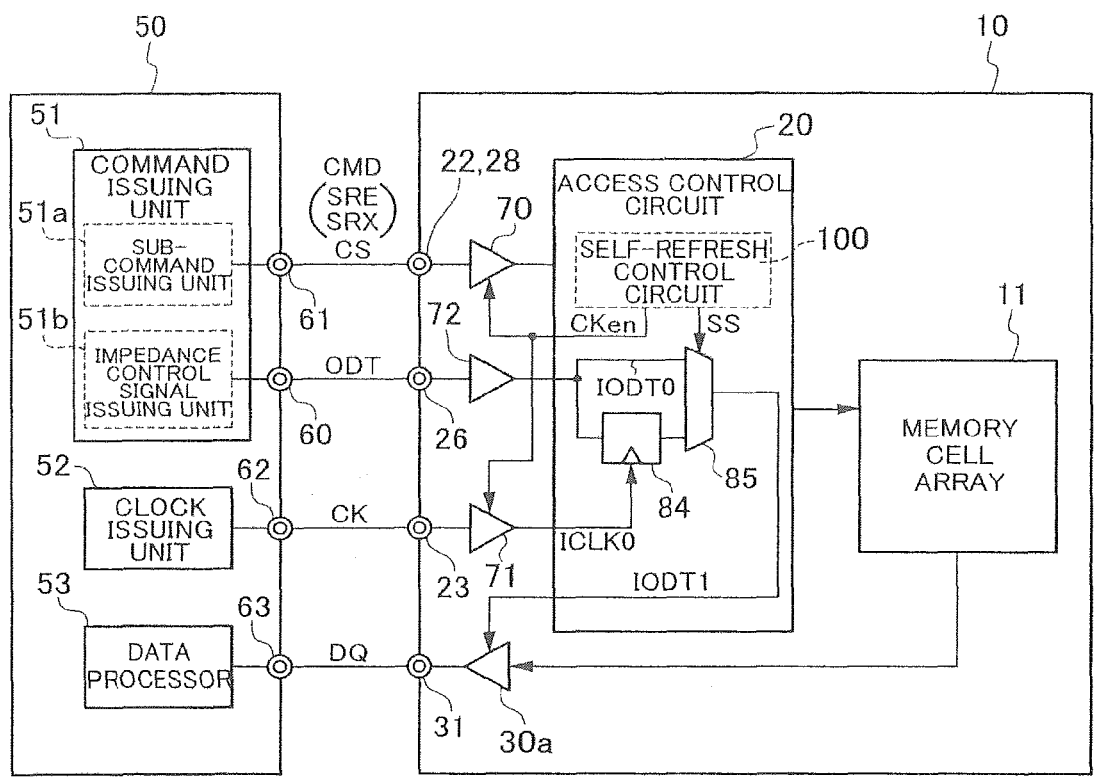
FIG. 1 is a schematic diagram for explaining an embodiment of the present invention.

Referring now to FIG. 1, it shows an information processing system including a controller 50 and a semiconductor device 10. The semiconductor device 10 includes a command terminal 22, a clock terminal 23, an impedance control terminal 26, and a data terminal 31, which are connected to a command terminal 61, a clock terminal 62, an impedance control terminal 60, and a data terminal 63 included in the controller 50, respectively. The command terminal 22 includes a chip select terminal 28 which will be explained later. The controller 50 includes a command issuing unit 51 that issues a command CMD, a clock issuing unit 52 that issues an external clock signal OK, and a data processor 53 that processes storage data DQ. The command terminal 22 includes a plurality of control pins (not shown), and plural commands (first and second commands, for example), which will be explained later, are defined by corresponding logical combinations of plural control signals. The command issuing unit 51 includes a sub-command issuing unit 51a and an impedance control signal issuing unit 51b. The sub-command issuing unit 51a is a circuit block that generates various commands and the impedance control signal issuing unit 51b is a circuit block that generates an impedance control signal ODT. In the present invention, an external clock signal having a predetermined frequency is also referred to as "synchronization signal" or "external synchronization signal". The controller 50 does not need to be configured with one chip and, for example, the clock issuing unit 52 and the other units can be configured with separate chips.

The command CMD issued by the controller 50 includes a self-refresh command SRE for entering the self-refresh mode, a self-refresh exit command SRX for exiting the self-refresh mode and the like, in addition to a row command and a column command.

Figure 2:
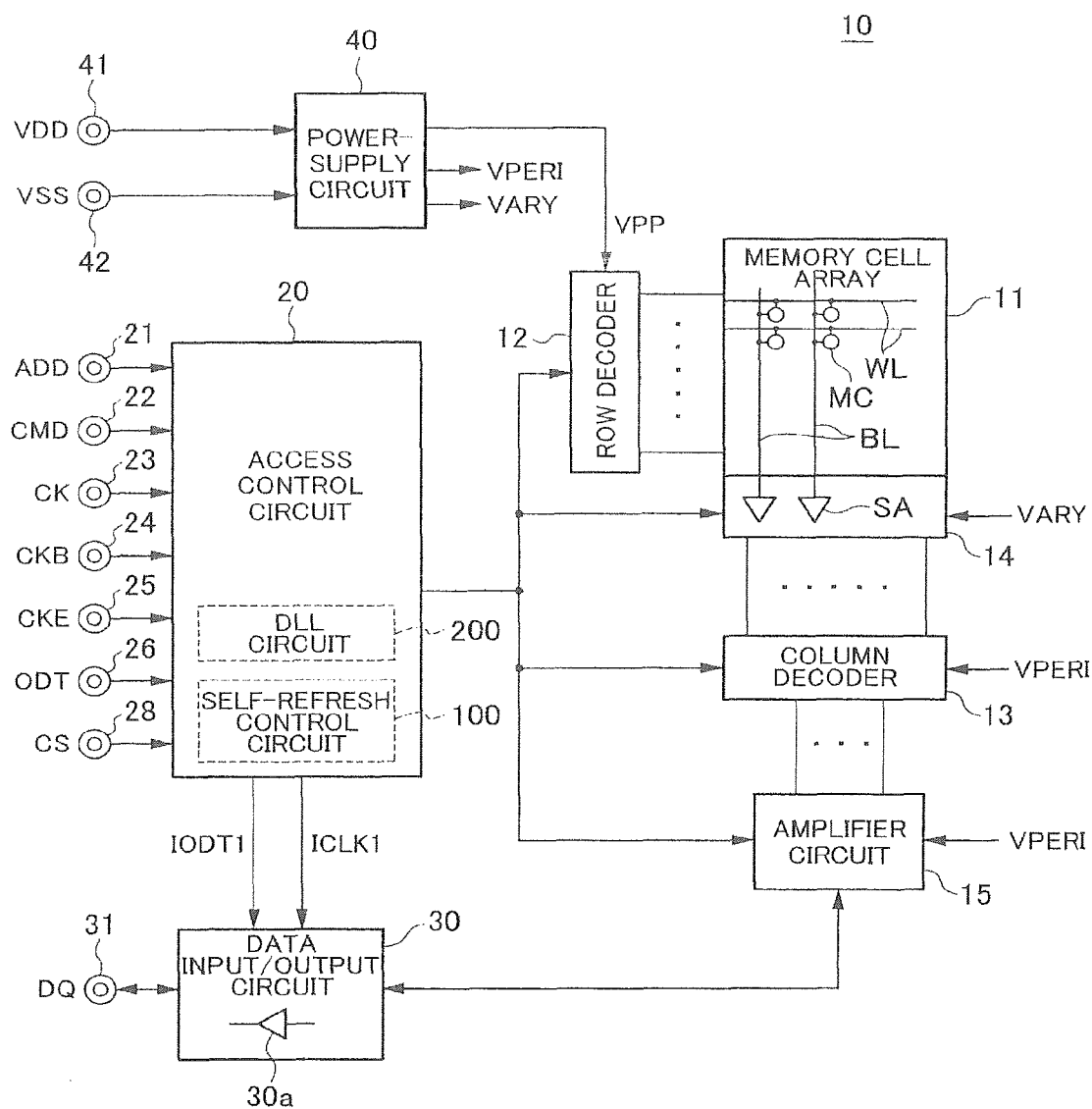
FIG. 2 is a block diagram indicative of an embodiment of a general configuration of a semiconductor device 10 according to a preferred embodiment of the present invention.

The row command causes the access control circuit 20 to perform an access to the memory cell array 11 based on a row address and corresponds to an active command ACT, an auto-refresh command REF and the like. In the present invention, these commands are also referred to as "first commands". On the other hand, the column command causes the access control circuit 20 to control a state of the data terminal 31 based on a column address and corresponds to a read command RD, a write command WT and the like. As shown in FIG. 2 explained later, when the read command RD is issued, data in an amplifier circuit 15 is output to outside through the data terminal 31. When the write command WT is issued, data supplied from outside is supplied to the amplifier circuit 15 through the data terminal 31. Although not relevant to the column address, an impedance control signal ODT used by the access control circuit 20 to control an impedance of the data terminal 31 also belongs to the column command. Among these commands, the read command RD and the impedance control signal ODT are commands for controlling a state of the data terminal 31 in synchronism with the internal clock signal ICLK1 and these commands are also referred to as "second commands" in the present invention.

The semiconductor device 10 includes a memory cell array 11 that holds storage data, an output buffer circuit 30a that outputs the storage data read from the memory cell array 11, in synchronism with an internal clock signal ICLK1, and an access control circuit 20 that performs an access to the memory cell array 11. The access control circuit 20 includes a self-refresh control circuit 100, a latch circuit 84, and a selector 85. The self-refresh control circuit 100 inactivates an enable signal CKen during a period when the semiconductor device has entered the self-refresh mode, thereby bringing input buffer circuits 70 and 71 into an inactive state. The input buffer circuit 70 is a buffer circuit to which a command signal CMD is input, and the input buffer circuit 71 is a buffer circuit to which an external clock signal CK is input. In the present invention, the input buffer circuit 71 is also referred to as "first input buffer circuit". An input buffer circuit 72 to which an impedance control signal ODT is input is kept in an active state without being inactivated even when the semiconductor device has entered the self-refresh mode. In the present invention, the input buffer circuit 72 is also referred to as "second input buffer circuit".

An impedance control signal IODT0 received by the input buffer circuit 72 is supplied to the latch circuit 84 and the selector 85. The latch circuit 84 latches the impedance control signal IODT0 in synchronism with an internal clock signal ICLK0 received by the input buffer circuit 71. The selector 85 is a circuit that selects either the impedance control signal IODT0 latched by the latch circuit 84 or the impedance control signal IODT0 having bypassed the latch circuit 84. Selection is determined according to a self-state signal SS output from the self-refresh control circuit 100. The self-state signal SS is activated during a period when the semiconductor device has entered the self-refresh mode, and the selector 85 selects the impedance control signal IODT0 having bypassed the latch circuit 84 when the self-state signal SS is in an active state. When the self-state signal SS is an inactive state, the selector 85 selects the impedance control signal IODT0 latched by the latch circuit 84.

An impedance control signal IODT1 output from the selector 85 is supplied to the output buffer circuit 30a. This causes the output buffer circuit 30a to change an impedance of the data terminal 31 based on the impedance control signal IODT1. As a result, when the impedance control signal ODT is issued while the semiconductor device has not entered the self-refresh mode, the impedance of the data terminal 31 changes in synchronism with the external clock signal CK. On the other hand, when the impedance control signal ODT is issued while the semiconductor device has entered the self-refresh mode, the impedance of the data terminal 31 changes in asynchronism with the external clock signal CK. Therefore, an impedance control of the data terminal 31 can be executed without issuing the external clock signal CK from the controller 50 during the self-refresh mode.

Preferred embodiments of the present invention will be explained below in detail with reference to the accompanying drawings.

Turning to FIG. 2, the semiconductor device 10 according to the present embodiment is a DRAM and includes the memory cell array 11. The semiconductor device 10 is mainly constituted by an N-channel transistor and a P-channel transistor. In the memory cell array 11, a plurality of word lines WL and a plurality of bit lines BL intersecting with each other are provided and a plurality of memory cells MC are arranged at intersections thereof, respectively. Selection of a word line ML is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA. As explained later, the memory cell array 11 is divided into eight banks.

Operations of the row decoder 12, the column decoder 13, the sense circuit 14, and the amplifier circuit 15 are controlled by the access control circuit 20. An address signal ADD, the command signal CMD, external clock signals CK and CKB, a clock enable signal CKE, the impedance control signal ODT, and a chip select signal CS are supplied to the access control circuit 20. These signals are input from outside through corresponding terminals 21 to 26 and 28. The external clock signals CK and CKB are synchronization signals complementary to each other. The chip select signal CS is used by the controller 50 to select the semiconductor device (the access control circuit 20). The access control circuit 20 controls the row decoder 12, the column decoder 13, the sense circuit 14, the amplifier circuit 15, and a data input/output circuit 30 based on these signals.

Specifically, when the command signal CMD indicates the active command ACT, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing. This operation is also referred to as "access to storage data" and a command for performing this operation is also referred to as "first command".

When the command signal CMD indicates the read command RD or the write command WT, the address signal ADD is supplied to the column decoder 13. In response thereto, the column decoder 13 connects a bit line DL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit and the sense amplifier SA. This operation is also referred to as "output of storage data" and a command for performing this operation is also referred to as "second command".

When the command signal CMD indicates the auto-refresh command REF, the access control circuit 20 supplies a count value (refresh address) of a refresh counter (not shown) to the row decoder 12. In response thereto, the row decoder 12 selects a word line WL indicated by the refresh address and accordingly memory cells MC connected to the selected word line WL are refreshed by the sense amplifiers SA. This operation is also referred to as "access to storage data" and a command for performing this operation is also referred to as "first command".

Furthermore, when the command signal CMD indicates the self-refresh command SRE, a self-refresh control circuit 100 included in the access control circuit 20 starts to cause the semiconductor device 10 to enter the self-refresh mode. When the command signal CMD indicates the self-refresh exit command SRX, the semiconductor device 10 exits the self-refresh mode.

As shown in FIG. 2, the access control circuit 20 includes the DLL circuit 200. The DLL circuit 200 receives the external clock signals CK and CKB and generates the internal clock signal ICLK1 phase-controlled, based on the received signal. The DLL circuit 200 includes a delay circuit (corresponding to reference numeral 210 in FIG. 7) that delays the external clock signals CK and CKB, a delay adjusting circuit (corresponding to 220 and 250 in FIG. 67) that adjusts a delay amount of the delay circuit, and a phase comparing circuit (corresponding to 240 in FIG. 7) that compares phases of the internal clock signal ICLK1 output from the delay circuit and the external clock signals CK and CKB, and supplies a result of the comparison to the delay circuit. The internal clock signal ICLK1 is supplied to the output buffer circuit 30a included in the data input/output circuit 30 and accordingly read data DQ that are read from the memory cell array 11 are output from the data terminal 31 in synchronism with the internal clock signal ICLK1. An impedance control signal IODT1 is also supplied to the data input/output circuit 30. When the impedance control signal IODT1 is activated, the output buffer circuit 30a is brought into a predetermined state and accordingly the data terminal 31 is controlled to have a predetermined impedance. This operation is also referred to as "control of an impedance of the data terminal" and a command for performing this operation is also referred to as "second command".

When the semiconductor device 10 enters the self-refresh mode, the DLL circuit 200 is inactivated and power consumption is reduced. When the DLL circuit 200 is inactivated, update information that is held until then is discarded. This is because it is preferable that the DLL circuit 200 performs a cold start in conjunction with issuance of the self-refresh exit command SRX without referring to previous update information when the controller changes a frequency of the external clock signal CK during the self-refresh mode. The DLL circuit 200 is brought into a locked state by plural times of updating. The update information and lock will be explained later. During a period when the semiconductor device 10 has entered the self-refresh mode, the clock issuing unit 52 included in the controller 50 in principle stops issuance of the external clock signal CK. Stop means that the external clock signal CK keeps a high or low state without oscillating, or has a high impedance. When the self-refresh exit command SRX is issued, the DLL circuit 200 is temporarily activated and phase states of the external clock signal CK and the internal clock signal ICLK1 in the semiconductor device are updated. At that time, the DLL circuit 200 is not reset and the update information is maintained. Therefore, only a previous state is updated (a subsequent update value is determined based on a previous update value). Accordingly, a time required for the DLL circuit 200 to be locked (for the phases of the external clock signal CK and the internal clock signal ICLK1 in the semiconductor device to be almost matched with each other) after the DLL circuit 200 is activated in response to issuance of the self-refresh exit command SRX is quite short. During a period when the DLL circuit 200 is activated, the external clock signal CK is issued from the clock issuing unit 52 included in the controller 50. That is, the external clock signal CK is issued from the clock issuing unit 52 only corresponding to a period when the DLL circuit 200 is activated.

These circuit blocks use predetermined internal voltages as operating power. These internal voltages are generated by a power-supply circuit 40 shown in FIG. 2. The power-supply circuit 40 receives an external potential VDD and a ground potential VSS supplied through power-supply terminals 41 and 42, respectively, and generates internal voltages VPP, VPERI, VARY and the like based on these potentials. The internal voltage VPP is generated by increasing the external potential VDD and the internal voltages VPERI and VARY are generated by decreasing the external potential VDD. The power-supply circuit 40 also generates a negative voltage (not shown).

The internal voltage VPP is mainly used by the row decoder 12. The row decoder 12 drives a word line WL selected based on the address signal ADD to a VPP level, thereby bringing cell transistors included in the memory cells MC into conduction. The internal voltage VARY is mainly used by the sense circuit 14. When activated, the sense circuit 14 drives one of paired bit lines to a VARY level and the other bit line to a VSS level, thereby amplifying read data that have been read. The internal voltage VPERI is used as an operating voltage for most of peripheral circuits such as the access control circuit 20. Power consumption of the semiconductor device 10 is reduced by using the internal voltage VPERI lower than the external voltage VDD as the operating voltage for these peripheral circuits.

Figure 3:
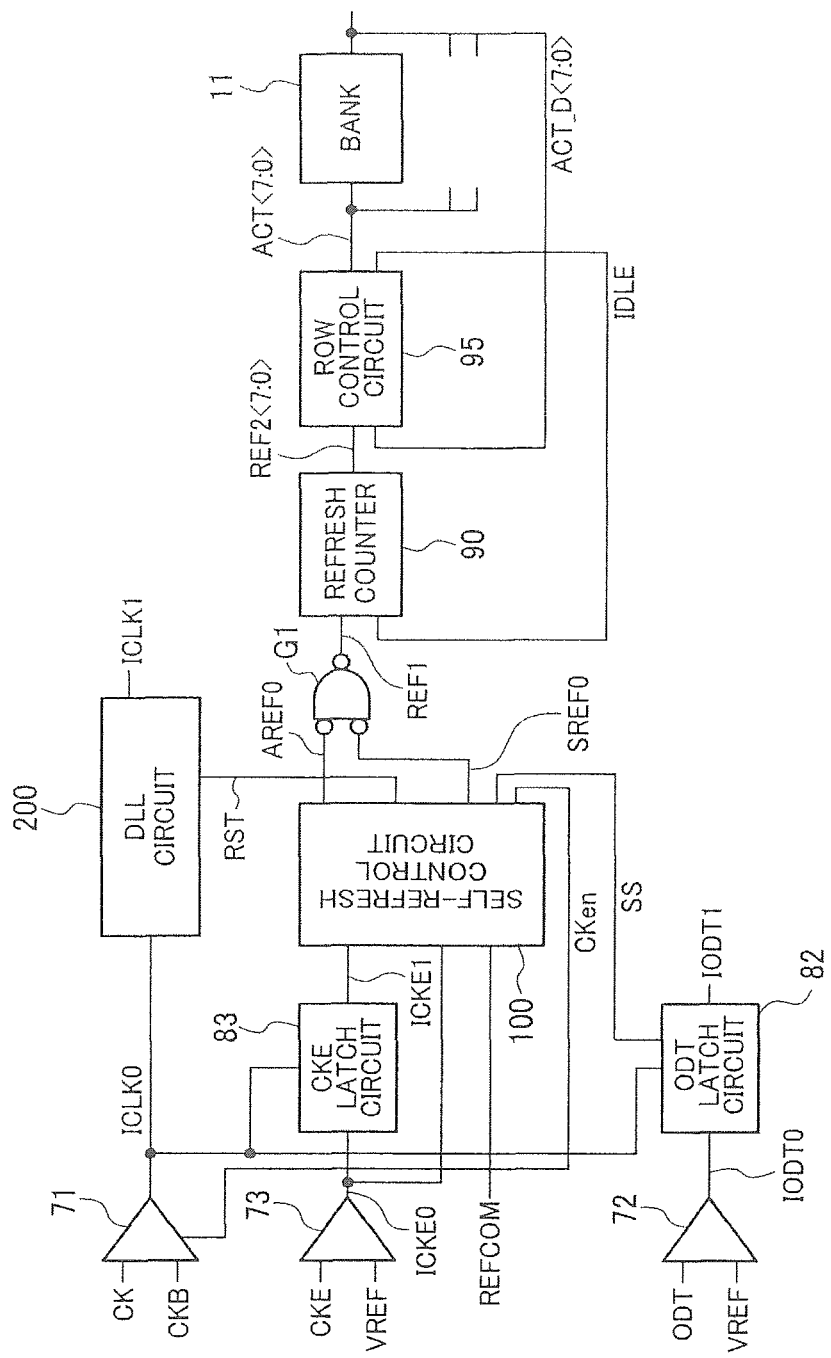
FIG. 3 is a block diagram indicative of an embodiment of main circuit blocks included in an access control circuit 20 and shows a first embodiment of the present invention.

Turning to FIG. 3, the access control circuit 20 includes input buffer circuits 71 to 73. The input buffer circuit 71 receives the external clock signals CK and CKB and generates the internal clock signal ICLK0, and is also referred to as "first input buffer circuit" in the present invention. The input buffer circuit 72 receives the impedance control signal CDT and generates an impedance control signal IODT0, and is also referred to as "second input buffer circuit" in the present invention. The input buffer circuit 73 receives the clock enable signal CKE and generates a clock enable signal ICKE0, and is also referred to as "third input buffer circuit" in the present invention. The input buffer circuit 71 is activated or inactivated according to an enable signal CKen. The input buffer circuit 71 is activated when the enable signal CKen is high. On the other hand, the input buffer circuits 72 and 73 are always activated. This is because, in the first embodiment, the impedance control signal ODT is issued also while the semiconductor device has entered the self-refresh mode and thus the input buffer circuit 72 needs to be activated. Further, because the self-refresh exit command SRX is indicated by the clock enable signal CKE and thus the input buffer circuit 73 needs to be activated also in the self-refresh mode. The self-refresh command SRE is indicated by the command CMD input through the command terminal 22 and the clock enable signal CKE input through the clock enable terminal 25.

Turning to FIG. 4, each command is represented by a combination of the command signals CMD and a logic level of the clock enable signal CKE. In FIG. 4, "H" denotes a high level, "L" denotes a low level, and "–" denotes "Don't care". Furthermore, "CSB", "RASH", "CASH", and "WEB" denote a chip select signal, a row-address strobe signal, a column-address strobe signal, and a write enable signal, respectively. These signals CSB, RASH, CASB, and WEB are signals constituting the command signals CMD.

Specifically, when the signals CSB, RASH, and CASH are set to a low level (L) and the signal WEB is set to a high level (H) with the clock enable signal CKE kept at a high level (H), this is handled as the auto-refresh command REF. When the clock enable signal CKE is changed from the high level (H) to a low level (L) with the signals CSB, RASH, and CASH set at the low level (L) and the signal WEB set at the high level (H), this is handled as the self-refresh command SRE. When the clock enable signal CKE is changed from the high level (H) to the low level (L) with the signal CSB set at the low level (L) and the signals RASH, CASH, and WEB set at the high level (H), this is handled as a power-down command PDE. When the clock enable signal CKE is changed from the low level (L) to the high level (H) with the signal CSB set at the high level (H), this is handled as the self-refresh exit command SRX or a power-down exit command PDX.

The internal clock signal ICLK0 output from the input buffer circuit 71 is supplied to the DLL circuit 200. The DLL circuit 200 generates the internal clock signal ICLK1 phase-controlled, based on the internal clock signal ICLK0. Operation states of the DLL circuit 200 include a first active state, a second active state, and an inactive state, details of which will be explained later.

The first active state is an operation state where the delay circuit, the delay adjusting circuit, and the phase comparing circuit are active and thus the internal clock signal ICLK1 phase-controlled is continuously generated, and the DLL circuit 200 is brought into this operation state when a read command and the impedance control signal ODT are issued. Therefore, the internal clock signal ICLK1 generated in the first active state is supplied to the output buffer circuit 30*a* shown in FIG. 2. The second active state is an operation state where the internal clock signal ICLK1 phase-controlled is generated at a predetermined time interval, and the delay circuit, the delay adjusting circuit, and the phase comparing circuit are activated at the predetermined time interval. This is an update operation of confirming phases of the internal clock signal ICLK1 and the external clock signals CK and CKB at the predetermined time interval to eliminate phase shifting due to temperature or voltage changes. Specifically, this is an operation of updating information of the delay amount provided by the delay adjusting circuit to the delay circuit at the predetermined time interval. Therefore, the internal clock signal ICLK1 generated in the second active state does not need to be supplied to the output buffer circuit 30*a* shown in FIG. 2. The inactive state is a state where the internal clock signal ICLK1 is not generated. However, information of the counter circuit 220 that holds update information included in the delay adjusting circuit is held.

The impedance control signal IOCDT0 supplied from the input buffer circuit 72 is latched by an ODT latch circuit 82. The ODT latch circuit 82 generates an impedance control signal IODT1 based on the impedance control signal IODT0. The impedance control signal IODT1 is supplied to the data input/output circuit 30 shown in FIG. 2.

Figure 5:
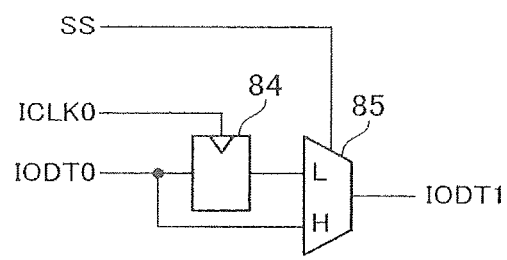
FIG. 5 is a circuit diagram indicative of an embodiment of an ODT latch circuit 82.

Turning to FIG. 5, the ODT latch circuit 82 includes a latch circuit 84 and a selector 85. The latch circuit 84 latches the impedance control signal IODT0 in synchronism with the internal clock signal ICLK0. The selector 85 is a circuit that selects one of an output from the latch circuit 84 and the impedance control signal IODT0, and selection is Performed based on the self-state signal SS. Specifically, the output from the latch circuit 84 is selected when the self-state signal SS has a low level and the impedance control signal IODT0 is selected when the self-state signal SS has a high level. This means that the output from the latch circuit 84 is used as the impedance control signal IODT1 during a period when the semiconductor device is not in the self-refresh mode and that the impedance control signal IODT0 is used as it is as the impedance control signal IODT1 during a period when the semiconductor device has entered the self-refresh mode.

The clock enable signal ICKE0 output from the input buffer circuit 73 is latched by a CKE latch circuit 83. The CKE latch circuit 83 latches the clock enable signal ICKE0 in synchronism with the internal clock signal ICLK0, and a clock enable signal ICKE1 output from the CKE latch circuit 83 is supplied to the self-refresh control circuit 100.

The self-refresh control circuit 100 is a circuit block that receives the clock enable signals ICKE0 and ICKE1, and a refresh command REFCOM and generates various internal signals. The refresh command REFCOM is common to the auto-refresh command REF and the self-refresh command SRE included in the command signal CMD. The refresh command REFCOM is a signal that becomes active when the auto-refresh command REF or the self-refresh command SRE is input. The internal signals generated by the self-refresh control circuit 100 include an auto-refresh signal AREF0, the self-refresh signal SREF0, the enable signal CKen, the self-state signal SS, and the reset signal RST. A specific circuit configuration of the self-refresh control circuit 100 is explained later.

As shown in FIG. 3, the auto-refresh signal AREF0 and the self-refresh signal SREF0 are supplied to an OR gate circuit G1, and a refresh signal REF1 output therefrom is supplied to a refresh counter 90. The refresh counter 90 generates eight refresh signals REF2<7:0> with a small shift from each other eight consecutive times in a time sequence, respectively, in response to a plurality of toggles of the refresh signal REF1 and an idle signal IDLE. In the first embodiment, the memory cell array 11 is divided into eight banks and the refresh signals REF2<7:0> are used as refresh signals for corresponding banks <7:0>, respectively. That is, the idle signal IDLE is toggled seven times in response to one refresh signal REF1, so that each of the eight refresh signals REF2<7:0> is generated eight times in a row, thereby selecting 64 word lines.

The refresh signals REF2<7:0> are supplied to a row control circuit 95. The row control circuit 95 includes an address counter that has a refresh address stored therein and, when the refresh signals REF2<7:0> are activated, outputs the refresh address together with active signals ACT<7:0> to the corresponding banks <7:0>, respectively. When the active signals ACT<7:0> are activated, a word line indicated by the refresh address is accessed in the corresponding banks <7:0>, respectively. Delayed active signals ACT_D<7; 0> are then fed back from the corresponding banks <7:0>, respectively, to the row control circuit 95, so that a next refresh address is supplied. The row control circuit 95 receives the delayed active signals ACT_D<7:0> and outputs the idle signal IDLE to the refresh counter 90. The refresh counter 90 increases a count value in response to the idle signal IDLE and generates the eight refresh signals REF2<7:0> again with a small shift with each other. Refresh of the banks <7:0> is performed by a staggered operation. This routine is repeated eight times. By repeating this operation a predetermined number of times (eight times, for example), eight word lines are selected in each of the banks <7:0> in a time sequence. In this way, a refresh operation for memory cells MC connected to a total of the 64 word lines is completed. That is, internal refresh is performed 64 times in a time sequence in response to activation of one refresh signal REF1.

Figure 6:
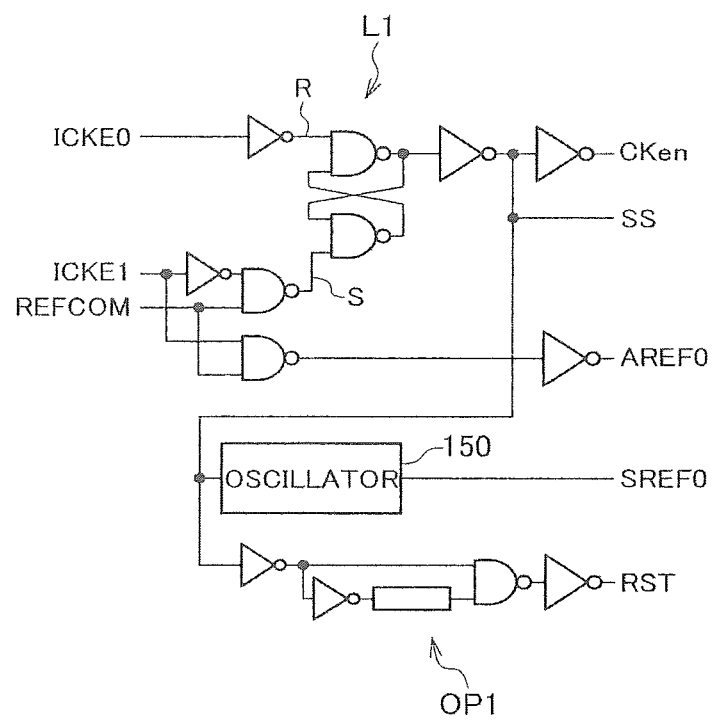
FIG. 6 is a main circuit: diagram indicative of an embodiment of a self-refresh control circuit 100 shown in FIG. 3.

Turning to FIG. 6, the self-refresh control circuit 100 includes an SR latch circuit L1 and an oscillator 150. Therefore, performing timings of the refresh operation are asynchronous with the external clock signal CK. Accordingly, when issuance of the self-refresh exit command SRX and an asynchronous refresh operation overlap, the latter has a priority. The SR latch circuit L1 includes a set node S and a reset node R and is set or reset when a low-level signal is input to the corresponding node.

To explain specifically, a signal indicating a negative AND of an inverse signal of the clock enable signal ICKE1 and the refresh command REFCOM is input to the set node S of the SR latch circuit L1. On the other hand, an inverse signal of the clock enable signal ICKE0 is input to the reset node R of the SR latch circuit L1 This causes the SR latch circuit L1 to be set when the clock enable signal ICKE1 has a low level and the refresh command REFCOM has a high level and to be reset when the clock enable signal ICKE0 has a high level. The clock enable signal ICKE1 has the low level and the refresh command REFCOM has the high level when the self-refresh command SRE is issued, and the clock enable signal ICKE0 has the high level when the self-refresh exit command SRX is issued. This means that the SR latch circuit L1 is set when the self-refresh command SRE is issued and reset when the self-refresh exit command SRX is issued.

A self-state signal SS output from the SR latch circuit L1 is inverted and used as an enable signal CKen. Therefore, the enable signal CKen has a low level when the SR latch circuit L1 is set, and is activated to a high level when the SR latch circuit L1 is reset.

The self-state signal SS is supplied also to the oscillator 150. The oscillator 150 starts when the SR latch circuit L1 is set and periodically generates the self-refresh signal SREF0. Generation timings of the self-refresh signal SREF0 are asynchronous with the external clock signal CK. The self-refresh signal SREF0 is supplied to the refresh counter 90 shown in FIG. 3. The clock enable signal ICKE1 has a high level and the refresh command REFCOM has a high level when the auto-refresh command REF is issued, and a signal indicating an AND of the clock enable signal ICKE1 and the refresh command REFCOM is used as the auto-refresh signal AREF0. The auto-refresh signal AREF0 is supplied to the refresh counter 90 shown in FIG. 3.

The self-state signal SS is supplied also to the one-shot pulse generating circuit OP1. The one-shot pulse generating circuit OP1 activates a reset signal RST in response to change of the self-state signal SS from a high level to a low level. This means that the reset signal RST is activated after the DLL circuit 200 is reset each time the self-refresh exit command SRX is issued.

Figure 7:
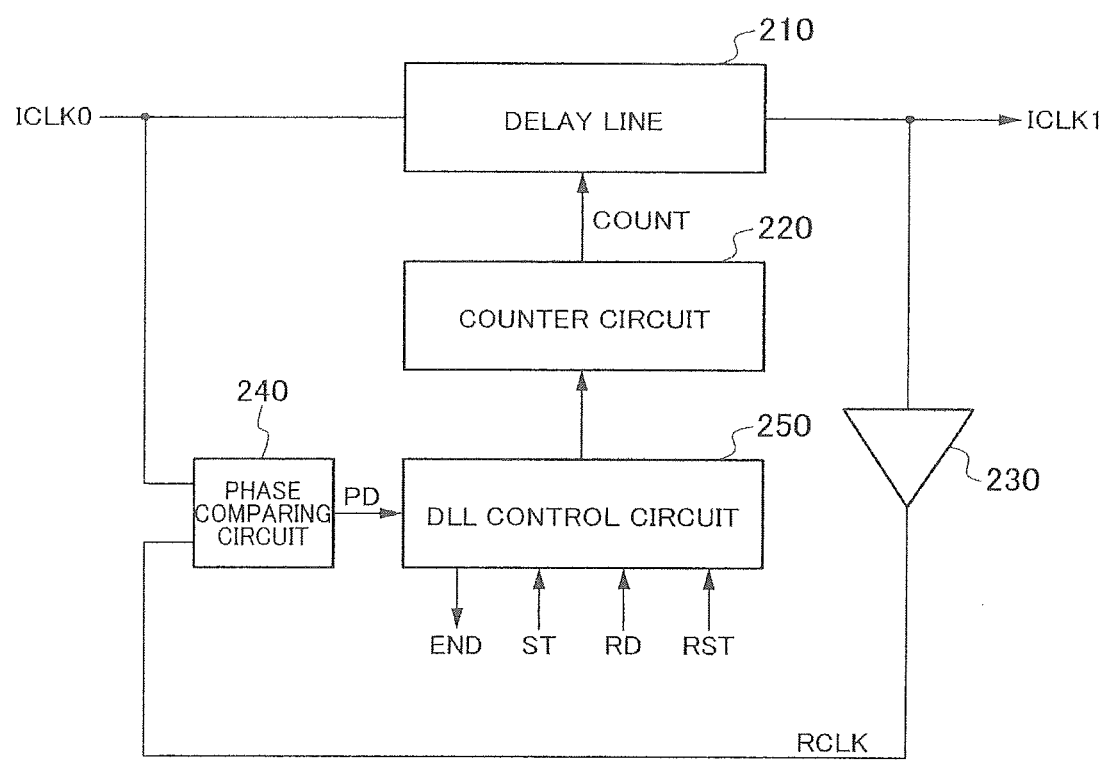
FIG. 7 is a block diagram indicative of an embodiment of a configuration of a DLL circuit 200.

Turning to FIG. 7, the DLL circuit 200 includes a delay line 210 that delays the internal clock signal ICLK0 to generate the internal clock signal ICLK1. The delay line 210 is a circuit that generates the internal clock signal ICLK1 by providing a delay corresponding to a count value COUNT of the counter circuit 220 to the internal clock signal ICLK0.

The internal clock signal ICLK1 is supplied to the output buffer circuit 30a shown in FIG. 2 and is supplied also to a replica buffer circuit 230. The replica buffer circuit 230 generates an internal clock signal RCLK as a replica based on the internal clock signal ICLK1 and has the same characteristics the output buffer circuit 30a. Because the output buffer circuit 30a outputs read data DQ in synchronism with the internal clock signal ICLK1, the internal clock signal RCLK output from the replica buffer circuit 230 is precisely synchronized with the read data DQ. In a DRAM, read data DQ needs to be precisely synchronized with the external clock signals CK and CKB and, when phase shifting occurs therebetween, the phase shifting needs to be detected and corrected. This detection is performed by the phase comparing circuit 240 and a result thereof is fed back to the counter circuit 220 through a DLL control circuit 250 to correct the phase shifting.

The phase comparing circuit 240 compares phases of the internal clock signal ICLK0 and the internal clock signal RCLK with each other and generates a phase determination signal PD based on a comparison result. The internal clock signal ICLK0 has the same timing as the external clock signals CK and CKB, and the internal clock signal RCLK has the same timing as read data DQ, which implies that the phase comparing circuit 240 indirectly compares phases of the external clock signals CK and CKB and the read data DQ with each other. When the comparison result indicates that the internal clock signal RCLK is behind the internal clock signal ICLK0, the phase determination signal PD is set to one of logic levels (a low level, for example). In response thereto, the DLL control circuit 250 counts down a count value of the counter circuit 220, thereby reducing a delay amount of the delay line 210. Conversely, when the internal clock signal RCLK is ahead of the internal clock signal ICLK0, the phase determination signal PD is set to the other logic level (a high level, for example). In response thereto, the DLL control circuit 250 counts up a count value of the counter circuit 220, thereby increasing a delay amount of the delay line 210. When phases of the internal clock signal ICLK0 and the internal clock signal RCLK are aligned with each other by periodically repeating this operation, phases of the read data DQ and the external clock signals CK and CKB are consequently aligned with each other.

The operation of the DLL control circuit 250 is controlled by a read signal RD, the update start signal ST, and the reset signal RST. The read signal RD is activated when a read command is issued and the DLL control circuit 250 continues the update operation of the counter circuit 220 while the read signal RD is activated. This corresponds to the first active state mentioned above and the internal clock signal ICLK1 phase-controlled is continuously generated. On the other hand, the update start signal ST is periodically activated during the periods in which the semiconductor device 10 is not in the self-refresh mode and, when the update start signal ST is activated, the DLL control circuit 250 performs the update operation of the counter circuit 220 for a predetermined period or a predetermined number of times. This corresponds to the second active state mentioned above and is performed to eliminate phase shifting caused by temperature or voltage changes. After the update operation of the counter circuit 220 is performed for the predetermined period or the predetermined number of times and thus the internal clock signal ICLK1 acquires a desired phase, the DLL control circuit 250 generates the update end signal END. At that time, the counter circuit 220 is not reset and transits to an inactive state with a count value at the time of generation of the update end signal END kept. Therefore, when the update start signal ST is periodically performed, the internal clock signal ICLK1 phase-controlled can be promptly generated when the read signal RD is issued.

The reset signal RST is activated when the DLL circuit 200 is to be entirely initialized and generated by the self-refresh control circuit 100 shown in FIG. 6. When the reset signal RST is activated, the count value of the counter circuit 220 is reset to an initial value and then the DLL circuit 200 is activated until the internal clock signal ICLK1 phase-controlled is generated. That is, previous update information is electrically discarded. Therefore, once the reset signal RST is activated, a certain time is required to enable output of the internal clock signal ICLK1 phase-controlled. The reset signal RST is automatically generated within the semiconductor device 10 and activated also when a reset command is issued from the controller 50.

The circuit configuration of the access control circuit 20 according to the first embodiment is as described above. An operation of the access control circuit 20 according to the first embodiment is explained next.

Figure 8:
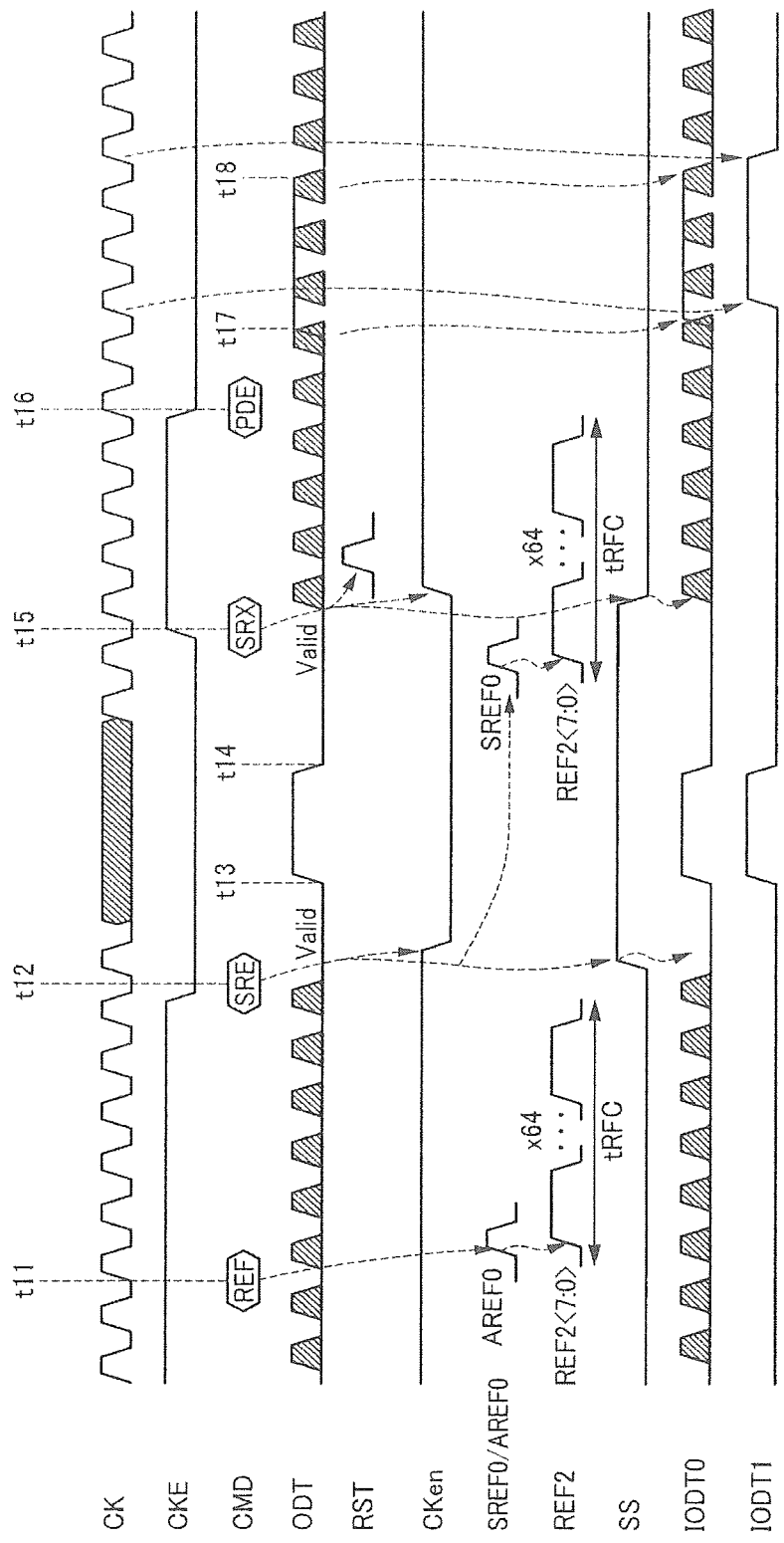
FIG. 8 is a timing chart for explaining an operation of the access control circuit 20 shown in FIG. 3.

Turning to FIG. 8, the auto-refresh command REF is issued at a time t11, the self-refresh command SRE is issued at a time t12, the self-refresh exit command SRX is issued at a time t15, and the power-down command PDE is issued at a time t16. Therefore, the semiconductor device 10 is in the self-refresh mode during a period of time from t12 to t15 and the semiconductor device 10 is in the power-down mode during a period after the time t16.

During the periods in which the semiconductor device 10 is not in the self-refresh mode, the SR latch circuit L1 shown in FIG. 6 is reset and thus the enable signal CKen is fixed to a high level. Accordingly, the input buffer circuit 71 shown in FIG. 3 is in an active state and the external clock signals CK and CKB can be input from the controller 50. Further, because the self-state signal SS is a low level, the impedance control signal IODT1 which is latched by the latch circuit 84 is output from the ODT latch circuit 82. That is, the impedance control signal IODT0 is latched by the CDT latch circuit 82 in synchronism with the internal clock signal ICLK0, and the impedance control signal IODT0 as a latched signal is supplied to the output buffer circuit 30a. Therefore, the impedance control signal CDT needs to be input in synchronism with a rising edge of the external clock signal CK. Accordingly, input of the impedance control signal CDT is effective during a period in which a setup margin and a hold margin from a rising edge of the external clock signal CK are ensured, and is ineffective in other periods. In FIG. 8, the periods in which input of the impedance control signal CDT is ineffective (Don't care) are shown by hatching.

When the auto-refresh command REF is issued at the time t11, the auto-refresh signal AREF0 is activated. In response thereto, the refresh counter 90 generates the refresh signals REF2<7:0> for the corresponding banks eight times and the row control circuit 95 supplies the active signals ACT<7:0> to the corresponding banks eight times. The refresh address is incremented in the row control circuit 95, which causes eight different word lines to be selected one after another in synchronism with the eight active signals ACT<7:0>. As a result, a total of 64 word lines are selected. To select these 64 word lines, a refresh period tRFC is required. Therefore, issuance of other commands by the controller 50 is inhibited after the auto-refresh command REF is issued and before the refresh period tRFC passes.

When the self-refresh command SRE is issued at the time t12, the SR latch circuit L1 shown in FIG. 6 is set, the self-state signal SS changes to a high level, and the enable signal CRen is changed to a Low level. This inactivates the input buffer circuit 71 shown in FIG. 3, thereby reducing power consumption. The clock issuing unit 52 of the controller 50 may stop supply of the external clock signal CK which it is continuing supplying till then in connection with issue of the self refresh command SRE during some period from the time t12 to the time t15. Power consumption of the system can be reduced.

When the semiconductor device enters the self-refresh mode, the oscillator 150 periodically outputs the refresh signal SREF0. When the refresh signal SREF0 is activated, the refresh counter 90 performs the same operation as that performed when the auto-refresh signal AREF0 is activated. That is, a total of 64 word lines are selected one after another.

Because the self-state signal SS is changed to a high level when the semiconductor device enters the self-refresh mode, the impedance control signal ODT supplied from the controller is introduced as it is as the impedance control signal IODT1. That is, the impedance control signal IODT1 is introduced independently of the external clock signals OK and ORB. In an example shown in FIG. 8, the impedance control signal ODT is activated to a high level during a period of time from t13 to t14 and is internally used as it is as the impedance control signal IODT1. As a result, although the input buffer circuit 71 that receives the external clock signals OK and ORB is inactivated during the period when the semiconductor device has entered the self-refresh mode, the output buffer circuit 30a shown in FIG. 2 can perform an impedance control of the data terminal 31 independently of the external clock signals OK and ORB.

When the self-refresh exit command SRX is issued at the time t15, the SR latch circuit L1 shown in FIG. 6 is reset and the enable signal CKen is changed to the high level. This activates the input buffer circuit 71 and enables input of the external clock signal CK and the impedance control signal ODT.

Furthermore, the reset signal RST is output from the one-shot pulse generating circuit OP1 in response to change of reset of the SR larch circuit L1. As described above, the reset signal RST is for entirely initializing the DLL circuit 200 and, when the reset signal RST is activated, the count value of the counter circuit 220 is reset to an initial value. Accordingly, a certain time is required to enable output of the internal clock signal ICLK1 phase-controlled. In this example, issuance of the second command is inhibited until 512 clock cycles have passed from issuance of the self-refresh exit command SRX. The 512 clock cycles are longer than a maximum period required to lock the DLL circuit 200 after the DLL circuit 200 is reset. That is, when the 512 clock cycles have passed, it means that the DLL circuit 200 is definitely locked.

On the other hand, the command for performing an access to the memory cell array 11 based on a row address, that is, the first command cannot be issued at least until passage of the refresh period tRFC from issuance of the self-refresh exit command SRX. This is because the refresh operation is performed in asynchronism with the external clock signal CK during the self-refresh mode and thus the refresh operation may be performed when the self-refresh exit command SRX is issued. A minimum period after the self-refresh exit command SRX is issued and before the first command can be issued is tRFC+10 ns, for example. That is, issuance of the first command is allowed when tRFC+10 ns have passed from issuance of the self-refresh exit command SRX.

In this example, the power-down command PDE is issued at the time t16 and the impedance control signal ODT is activated to the high level during a period of time from t17 and t18 in which the semiconductor device has entered the power-down mode. Because the impedance control signal ODT is introduced in synchronism with the internal clock signal ICLK0 during this period, the output buffer circuit 30a shown in FIG. 2 can perform an impedance control of the data terminal 31 in synchronism with the external clock signals CK and CKB.

Figure 9:
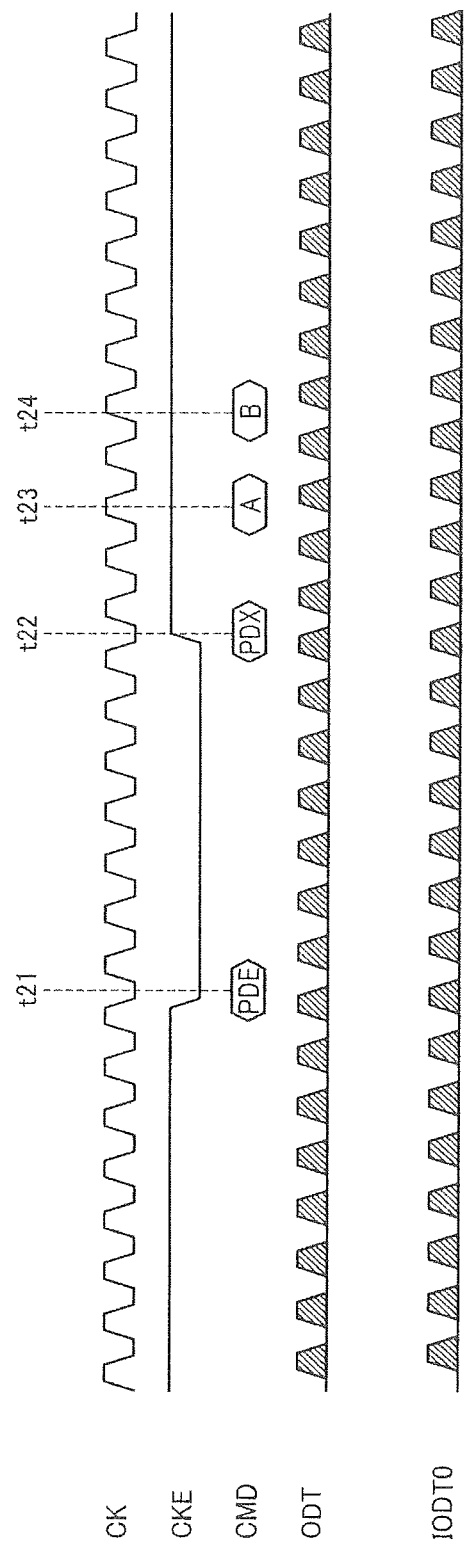
FIG. 9 is another timing chart for explaining an operation of the access control circuit 20 shown in FIG. 3.

Turning to FIG. 9, the power-down command PDE is issued at a time t21, the power-down exit command PDX is issued at a time t22, the first command A is issued at a time t23, and the second command B is issued at a time t24. Therefore, the semiconductor device 10 is in a power-down mode during a period of time from t21 to t22.

In this case, the power-down mode is an operation mode in which input of the first and second commands is inhibited as in the self-refresh mode compliant with the DRAM standards. Major differences of the power-down mode from the self-refresh mode are such that the controller needs to continuously supply the external clock signals OK and CKB to the semiconductor device 10 and can input the impedance control signal ODT in the power-down mode, and that the semiconductor device does not perform an automatic refresh operation (refresh of storage data), causes the DLL circuit to operate, and activates an input circuit (input buffer circuit) connected to an external terminal of the semiconductor device 10 while reducing power consumption of internal circuits of the semiconductor device 10 in the power-down mode and the like. For example, the input buffer circuit 71 connected to the clock terminals 23 and 24 is activated in the power-down mode and is inactivated in the self-refresh mode complying with the DRAM standards. Due to these differences, while a period before a command (the first command) can be input after power-down exit is advantageously shorter in the power-down mode than in the self-refresh mode, power consumption in the self-refresh mode is lower than in the power-down mode. This is particularly because the input buffer circuit 71 and the DLL circuit 200 are activated in the power-down mode.

A minimum period after the power-down exit command PDX is issued and before the first command A can be issued is shorter than a minimum period after the self-refresh exit command SRX is issued and before the first command A can be issued. Specifically, issuance of the first command A is allowed when, for example, 7.5 as have passed after issuance of the power-down exit command PDX. This is because no refresh operation is performed in the power-down mode and thus a state where no refresh operation is performed is ensured at a time when the power-down exit command PDX is issued.

A minimum period after the power-down exit command PDX is issued and before the second command B can be issued is shorter than a minimum period after the self-refresh exit command SRX is issued and before the second command B can be issued. Specifically, issuance of the second command B is allowed when, for example, 24 ns have passed after issuance of the power-down exit command PDX. This is because the external clock signal CK is input in the power-down mode and thus the update operation of the DLL circuit 200 can be performed, which enables the DLL circuit 200 to be kept in a locked state.

Because not specified in the DRAM standards, the operation of the first embodiment mentioned above cannot ensure as it is compatibility with a DRAM complying with the standards (JEDEC (Joint Electron Device Engineering Council) Solid State Technology Association). When this causes a problem, it is desirable to use a configuration that enables to switch between the operation of the first embodiment and the operation specified in the standards. That is, it suffices to design a circuit to perform the operation meeting the DRAM standards in the first operation mode and perform the operation of the first embodiment in the second operation mode.

Figure 10:
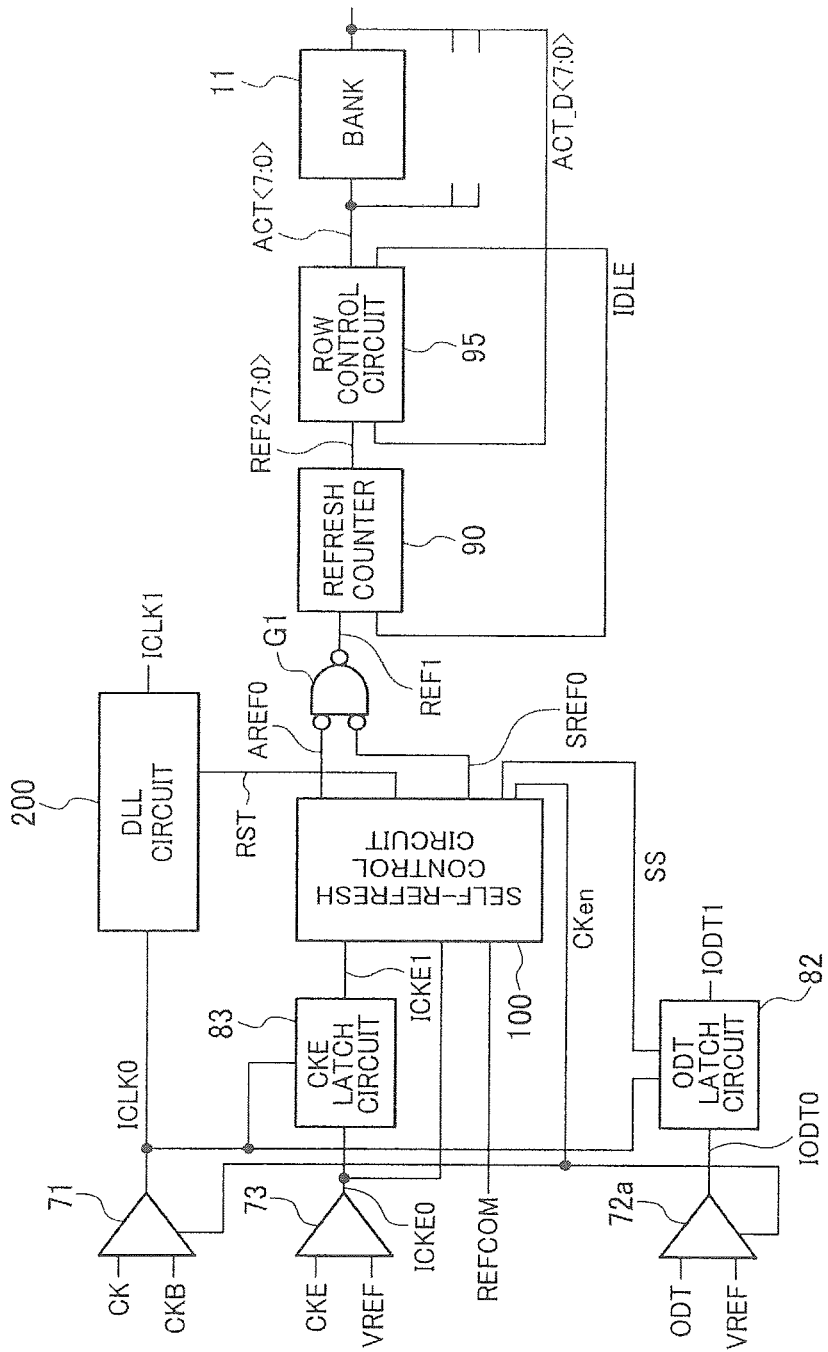
FIG. 10 is another block diagram indicative of an embodiment of main circuit blocks included in an access control circuit 20 and shows a case where an information processing system operates in a first operation mode complying with the DRAM standards.

Turning to FIG. 8, while a circuit shown in FIG. 10 is different from that shown in FIG. 3, it is unnecessary to separately provide the circuit shown in FIG. 3 and that shown in FIG. 10 but it suffices to switch functions according to a selected operation mode. Therefore, it suffices to realize function switching by using a gate circuit or the like (not shown) to function as the circuit shown in FIG. 10 when the first operation mode is selected and to function as the circuit shown in FIG. 3 when the second operation mode is selected.

In the access control circuit 20 shown in FIG. 10, the enable signal CKen is supplied to an input buffer circuit 72a in addition to the input buffer circuit 71. With this configuration, when the semiconductor device enters the self-refresh mode, the input buffer circuits 71 and 72a are both fixed to an inactive state. Accordingly, power consumption is reduced more than in the second operation mode.

Figure 11:
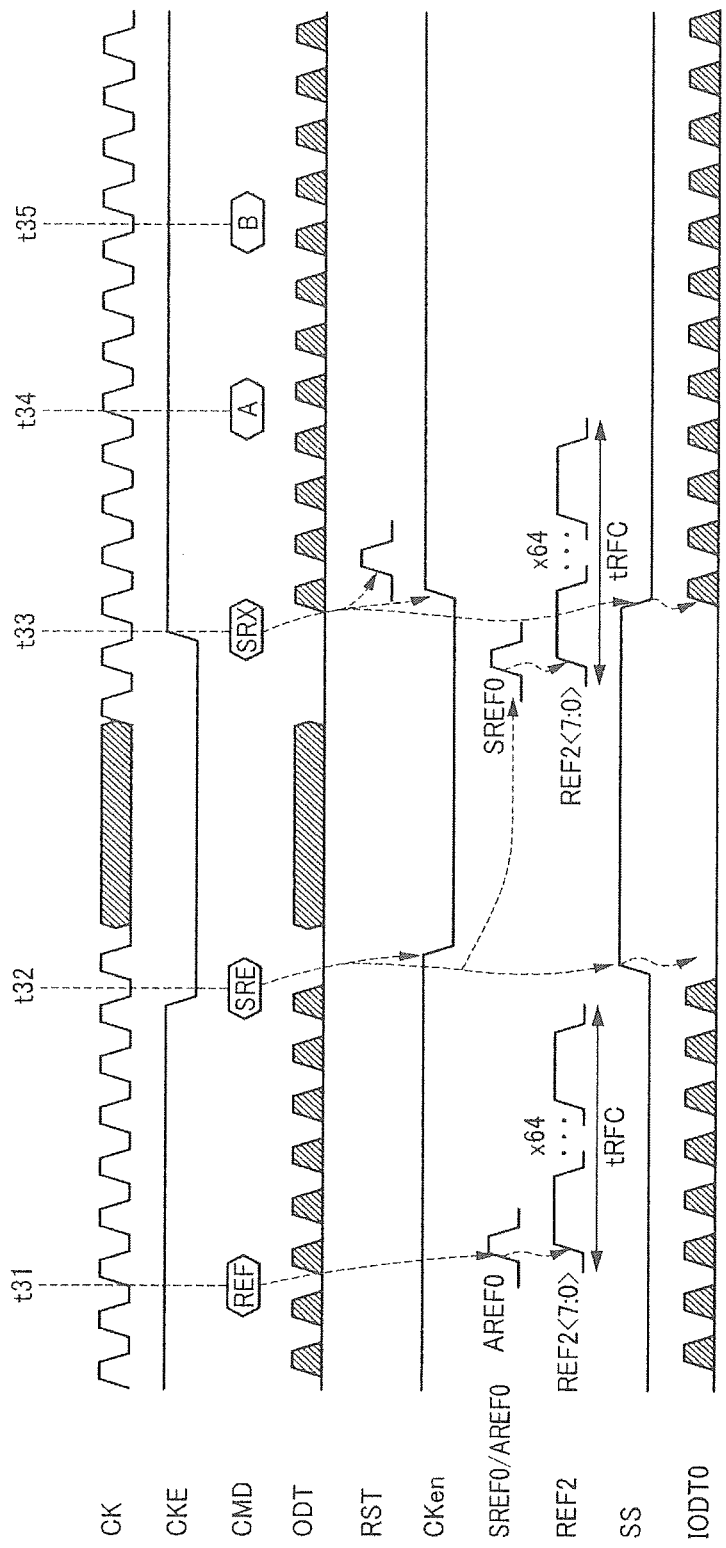
FIG. 11 is a timing chart for explaining an operation of the access control circuit 20 in the first operation mode.

Turning to FIG. 11, the auto-refresh command REF is issued at a time t31, the self-refresh command SRE is issued at a time t32, and the self-refresh exit command SRX is issued at a time t33. Therefore, the semiconductor device 10 is in the self-refresh mode during a period of time from t32 to t33 and the semiconductor device 10 is not in the self-refresh mode during other periods.

During the periods in which the semiconductor device 10 is not in the self-refresh mode, the SR latch circuit L1 shown in FIG. 6 is reset and thus the enable signal CKen is fixed to a high level. Accordingly, the input buffer circuits 71 and 72a shown in FIG. 3 are active. When the auto-refresh command REF is issued at the time t31 in this state, the auto refresh signal AREF0 is activated. An operation performed in this case is as explained with reference to FIG. 8.

Figure 16:
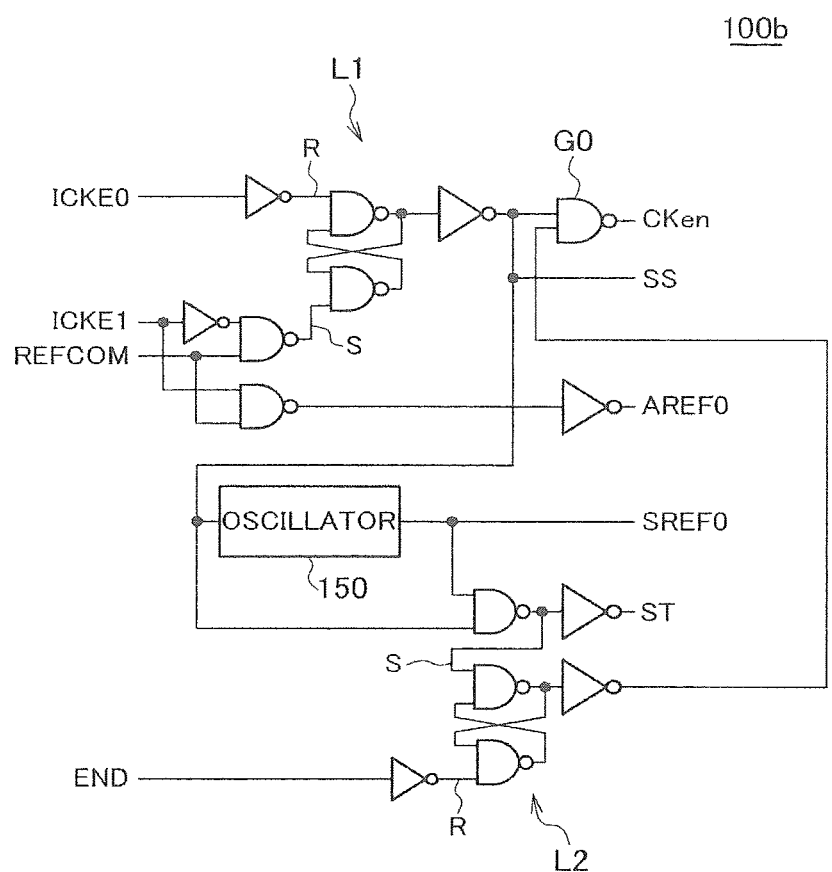
FIG. 16 is a main circuit diagram indicative of an embodiment of a self-refresh control circuit 100b shown in FIG. 15.

When the self-refresh command SRE is issued at the time t32, the SR latch circuit L1 shown in FIG. 6 is set and the enable signal CKen is changed to a low level. This inactivates the input buffer circuits 71 and 72a shown in FIG. 10 and reduces power consumption. The impedance control signal ODT cannot be input during a period when the semiconductor device has entered the self-refresh mode. In FIG. 11, the periods in which input of the impedance control signal ODT is ineffective (Don't care) are shown by hatching. In the example shown in FIG. 11, the impedance control signal CDT is not input (that is, Don't care) in most of the period when the semiconductor device 10 is in the self-refresh mode. The impedance control signal ODT cannot be supplied from the controller 50 in most of the period when the semiconductor device 10 is in the self-refresh mode because the input buffer circuit 72a is inactivated in this period. Specifically, logic of generating the enable signal CKen shown in FIG. 6 is simplified to facilitate understanding, and the input buffer circuit 72a shown in FIG. 10 is activated to introduce the impedance control signal ODT supplied from outside into the semiconductor device each time the self-refresh command SRE is issued at the time t12 and the self-refresh exit command SRX is issued at the time t13. The same holds true for the ODT latch circuit 82 that generates the impedance control signal IODT1 and the internal clock signal ICLK0 for controlling the ODT latch circuit 82. That is, the self-refresh control circuit 100 shown in FIG. 6 contributes to clear understanding of a difference from a self-refresh control circuit 100b according to a third embodiment, which is shown in FIG. 16 and explained later, for example.

When the semiconductor device 10 has entered the self-refresh mode, the refresh signal SREF0 is periodically output from the oscillator 150 and the same operation as in the case where the auto refresh signal AREF0 is activated is performed. While the refresh signal SREF0 is activated once in FIG. 11, the refresh signal SREF0 is periodically generated by the oscillator 150 during the period when the semiconductor device 10 has entered the self-refresh mode.

When the self-refresh exit command SRX is issued at the time t33, the SR latch circuit L1 shown in FIG. 6 is reset and the enable signal CKen is changed to the high level. This activates the input buffer circuits 71 and 72a and enables input of the external clock signal CK and the impedance control signal DDT. Furthermore, the reset signal RST is output from the one-shot pulse generating circuit OP1, thereby resetting the DLL circuit 200. Consequently, issuance of the second command is inhibited until the DLL circuit 200 is locked. In the example shown in FIG. 11, the second command B is issued at a time t35. A minimum period after the self-refresh exit command SRX is issued and before the second command B can be issued is the same between the first operation mode and the second operation mode.

A timing when the first command can be issued after the self-refresh exit command SRX is issued is the same as that in the second operation mode mentioned above. In the example shown in FIG. 11, the first command A is issued at a time t34.

As described above, when the first operation mode is selected, the operation complying with the standards is performed although the impedance control signal ODT cannot be issued during a period when the semiconductor device has entered the self-refresh mode. Therefore, compatibility with the existing DRAM can be ensured.

In either case where the first or second operation mode is selected, frequencies of the external clock signals CK and CKB can be changed when the semiconductor device enters the self-refresh mode and then exits the self-refresh mode. This is because the external clock signals CM and CKB are not used during the entry into the self-refresh mode.

Figure 12:
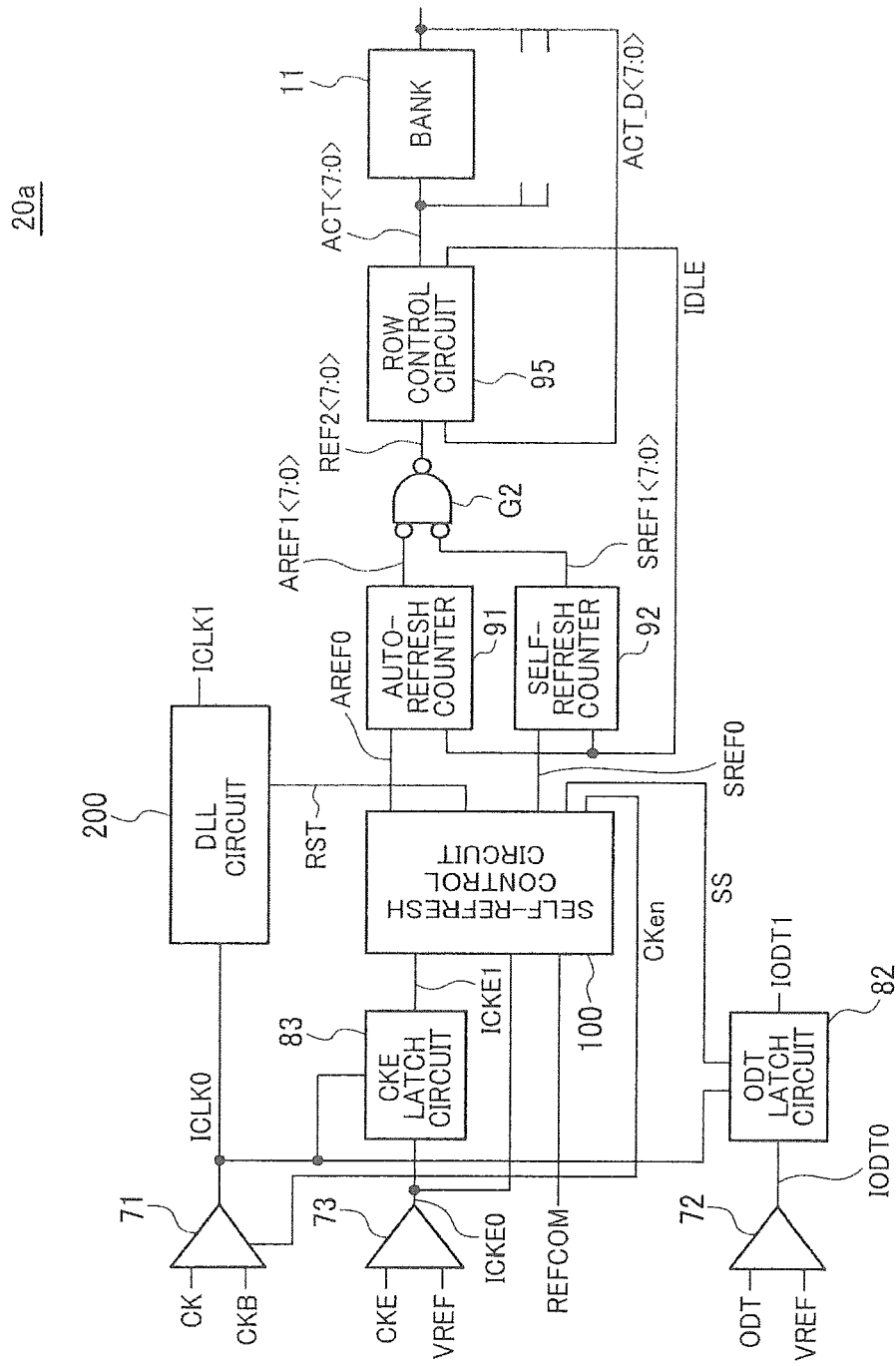
FIG. 12 is a block diagram indicative of an embodiment of main circuit blocks included in an access control circuit 20a according to a second embodiment.

Turning to FIG. 12, the access control circuit 20a is different from the access control circuit 20 shown in FIG. 3 in that an auto-refresh counter 91 and a self-refresh counter 92 are included instead of the refresh counter 90 and that an OR gate circuit G2 is arranged at a subsequent stage of the counters 91 and 92. Other features of the access control circuit 20a are basically the same as those of the access control circuit 20 shown in FIG. 3, and therefore like elements are denoted by like reference characters and redundant explanations thereof will be omitted.

As shown in FIG. 12, the auto-refresh signal AREF0 is supplied from the self-refresh control circuit 100 to the auto-refresh counter 91, and the self-refresh signal SREF0 is supplied from the self-refresh control circuit 100 to the self-refresh counter 92. The auto-refresh counter 91 outputs an auto-refresh signal AREF1<7:0> and the self-refresh counter 92 outputs a self-refresh signal SREF1. These auto-refresh signal AREF1<7:0> and self-refresh signal SREF1 are input to the OR gate circuit G2, and a refresh signal REF2 output thereof is supplied to the row control circuit 95. The auto-refresh counter 91 generates eight auto-refresh signals AREF1<7:0> with a small shift from each other eight consecutive times in a time sequence, respectively, in response to the auto-refresh signal AREF0. The self-refresh counter 92 generates eight self-refresh signals SREF1<7:0> with a small shift from each other two consecutive times in a time sequence, respectively, in response to the self-refresh signal SREF0.

Figures 13A, 13B:
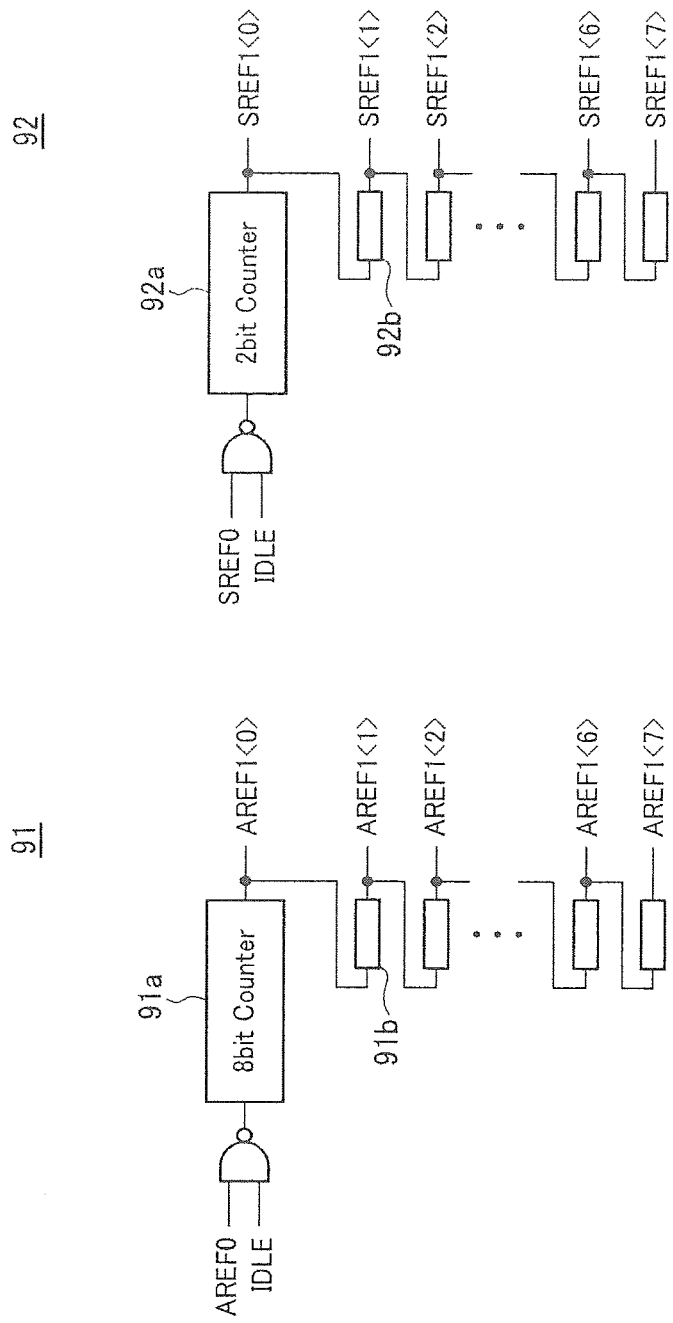
FIG. 13A is a circuit diagram indicative of an embodiment of an auto-refresh counter 91.
FIG. 13B is a circuit diagram indicative of an embodiment of a self-refresh counter 92.

Turning to FIG. 13A, the auto-refresh counter 91 includes an 8-bit counter 91*a* that performs an 8-count operation when the auto-refresh signal. AREF0 and the idle signal IDLE are both activated to a high level. The idle signal IDLE has a high level when the row control circuit 95 is in an idle state. Therefore, when the auto-refresh signal AREF0 is activated in a case where the row control circuit 95 is in an idle state, the 8-bit counter 91*a* generates an auto-refresh signal AREF1<0> eight times. Specifically, the idle signal IDLE is toggled seven times during a period when the auto-refresh signal AREF0 has a high level and the 8-bit counter 91*a* is counted up, thereby generating the auto-refresh signal AREF1<0> eight times. The auto-refresh signal AREF1<0> passes through a plurality of delay circuits 91*b* cascaded and is output as auto-refresh signals AREF1<1> to AREF1<7>. Accordingly, the auto-refresh signals AREF1<0> to AREF1<7> are activated in a staggered operation with timings thereof slightly shifted with each other. This is to shift timings of refresh operations in the respective banks with each other to suppress a peak current.

With this configuration, when the auto-refresh signal AREF0 is activated and the idle signal IDLE is toggled seven times in the case where the row control circuit 95 is in an idle state, each of the auto-refresh signals AREF1<0> to AREF1<7> is activated eight times. These signals are supplied to the row control circuit 95 through the OR gate circuit G2. When the refresh signal REF1 is activated, the refresh operation is performed for a refresh address indicated by an address counter included in the row control circuit 95 and also a value of the address counter is incremented (or decremented). This causes eight word lines to be selected one after another in each bank, so that memory cells MC connected to the selected word lines are refreshed. That is, 64 word lines are selected in response to one auto-refresh signal AREF0.

On the other hand, turning to FIG. 13B, the self-refresh counter 92 includes a 2-bit counter 92*a* that performs a 2-count operation when the self-refresh signal SREF0 and the idle signal IDLE are both activated to a high level. Therefore, when the self-refresh signal SREF0 is activated in a case where the row control circuit 95 is in an idle state, the 2-bit counter 92*a* generates a self-refresh signal SREF1<0> twice. Specifically, the idle signal IDLE is toggled once during a period when the self-refresh signal SREF0 has a high level and the 2-bit counter 92*a* is counted-up, thereby generating the self-refresh signal SREF1<0> twice. The self-refresh signal SREF1<0> passes through a plurality of delay circuits 92*b* cascaded and is output as self-refresh signals SREF1<1> to SREF1<7>.

With this configuration, when the self-refresh signal SREF0 is activated in the case where the row control circuit 95 is in an idle state, each of the self-refresh signals SREF1<0> to SREF1<7> is activated twice. This causes two word lines to be selected one after the other in each bank, so that memory cells MC connected thereto are refreshed. That is, 16 word lines are selected in response to one self-refresh signal self0.

Figure 14:
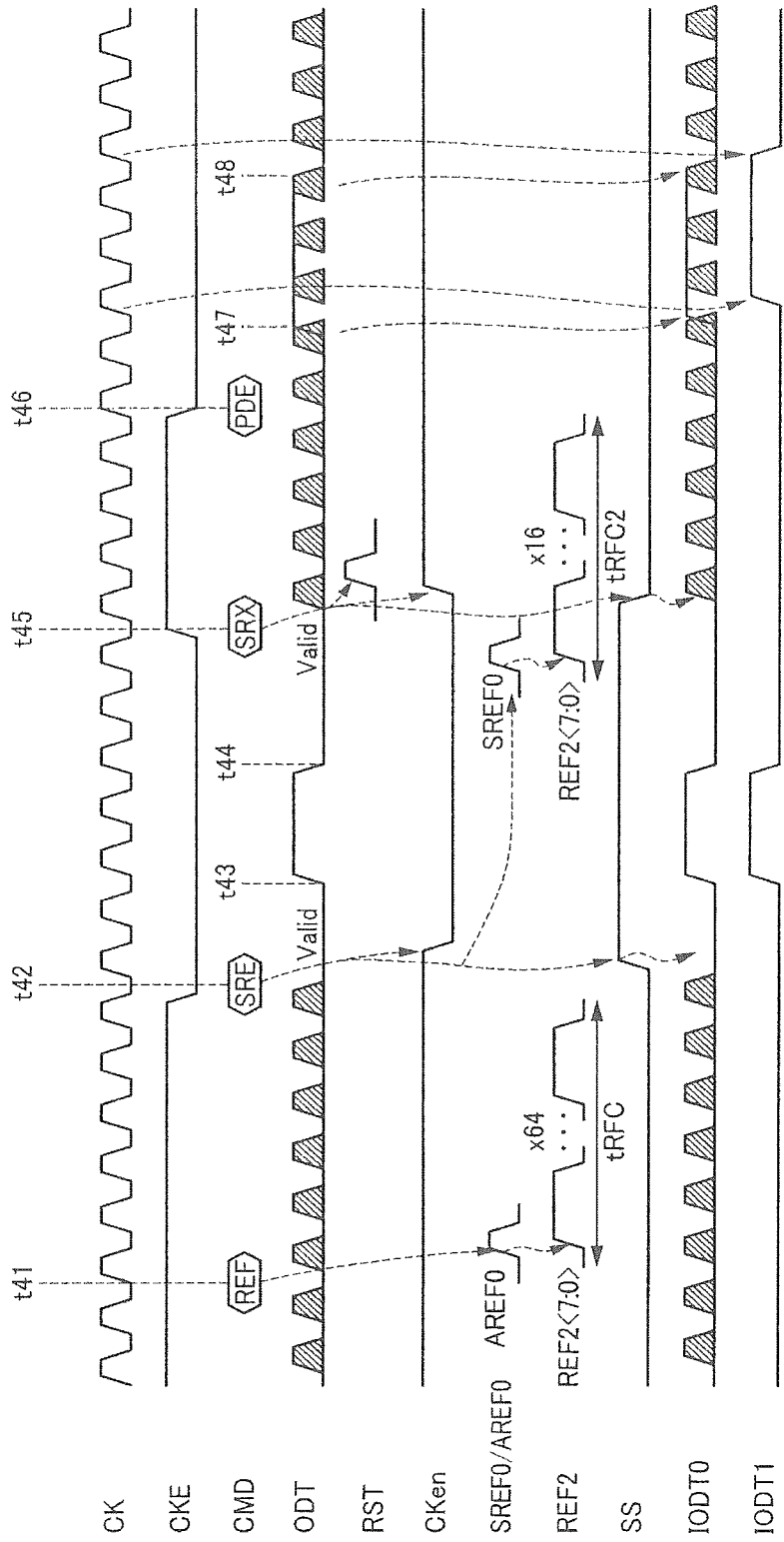
FIG. 14 is a timing chart for explaining an operation of the access control circuit 20a shown in FIG. 12.

Turning to FIG. 14, the auto-refresh command REF is issued at a time t41, the self-refresh command SRE is issued at a time t42, the self-refresh exit command SRX is issued at a time t45, and the power-down command PDE is issued at a time t46. Therefore, the semiconductor device 10 is in the self-refresh mode during a period of time from t42 to t45 and the semiconductor device 10 is in the power-down mode during a period after the time t46.

An operation performed during a period before the semiconductor device 10 enters the self-refresh mode is the same as that in the first embodiment. Therefore, when the auto-refresh command REF is issued at the time t41, the row control circuit 95 supplies an active signal to each bank eight times. This causes eight word lines to be selected one after another, so that memory cells MC connected to a total of 64 word lines are refreshed. As mentioned above, the refresh period tRFC is required to select 64 word lines. Therefore, issuance of other commands is inhibited until the refresh period tRFC has passed after issuance of the auto-refresh command REF.

When the self-refresh command SRE is issued at the time t42, the semiconductor device 10 enters the self-refresh mode. When the semiconductor device 10 has entered the self-refresh mode, and refresh signal SREF0 periodically output from the oscillator 150.

When the refresh signal SREF0 is activated, the self-refresh signal SREF1<0> is output twice by the 2-bit counter 92*a* included in the self-refresh counter 92, and the row control circuit 95 supplies the active signals ACT<7:0> to the corresponding banks twice. This causes two word lines to be selected one after the other, so that memory cells MC connected to a total of 16 word lines are refreshed. A refresh period tRFC2 required to select 16 word lines is shorter than the refresh period tRFC required to select 64 word lines and is about a quarter thereof. Accordingly, a period when the oscillator 150 issues the refresh signal SREF0 is also reduced to a quarter of that in the first embodiment.

When the semiconductor device enters the self-refresh mode, as is the case with the first embodiment, the impedance control signal CDT supplied from the controller is introduced as it is as the impedance control signal IODT1. That is, the impedance control signal IODT1 is introduced independently of (in asynchronism with) the external clock signals CK and CKB. In an example shown in FIG. 14, the impedance control signal CDT is activated to a high level during a period of time from t43 to t44 and is internally used as it is as the impedance control signal IODT1.

When the self-refresh command SRX is issued at the time t45, the SR latch circuit L1 is reset and the enable signal CKen changes to a high level. Accordingly, the input buffer 71 is activated and input of the external clock signal CK is enabled. In response to that the SR latch circuit L1 is reset, the reset signal RST is output from the one-shot pulse generating OP1 and the DLL circuit 200 is reset. A certain time is required to enable output of the internal clock signal ICLK1 phase-controlled.

On the other hand, the command for performing an access to the memory cell array 11 based on a row address, that is, the first command cannot be issued at least until passage of the refresh period tRFC2 from issuance of the self-refresh exit command SRX. In the second embodiment, a minimum period after the controller issues the self-refresh exit command SRX and before the first command can be issued is tRFC2+10 ns, for example. That is, issuance of the first command is allowed when tRFC2+10 no have passed from issuance of the self-refresh exit command SRX. Because tRFC2<tRFC, the period from issuance of the self-refresh exit command SRX until the first command can be input can be greatly reduced as compared to the first embodiment.

In this example, the power-down command PDE is issued at the time t46 and the impedance control signal ODT is activated to the high level during a period of time from t47 and t48 in which the semiconductor device has entered the power-down mode. Because the impedance control signal ODT is introduced in synchronism with the internal clock signal ICLK0 during this period, the output buffer circuit 30a shown in FIG. 2 can perform an impedance control of the data terminal 31 in synchronism with the external clock signals CK and CKB.

As described above, according to the second embodiment, the effect of the first embodiment mentioned above can be obtained and also the period from issuance of the self-refresh exit command SRX until the first command can be input can be greatly reduced. Also the operation of the second embodiment is not specified in the DRAM standards and thus it is desirable to use a configuration that enables switching between the operation of the second embodiment and the operation specified in the standards. That is, it suffices to design a circuit to perform the operation complying with the DRAM standards in the first operation mode and perform the operation of the second embodiment mentioned above in the second operation mode. The first operation mode is as already explained.

The third embodiment of the present invention is explained next.

Figure 15:
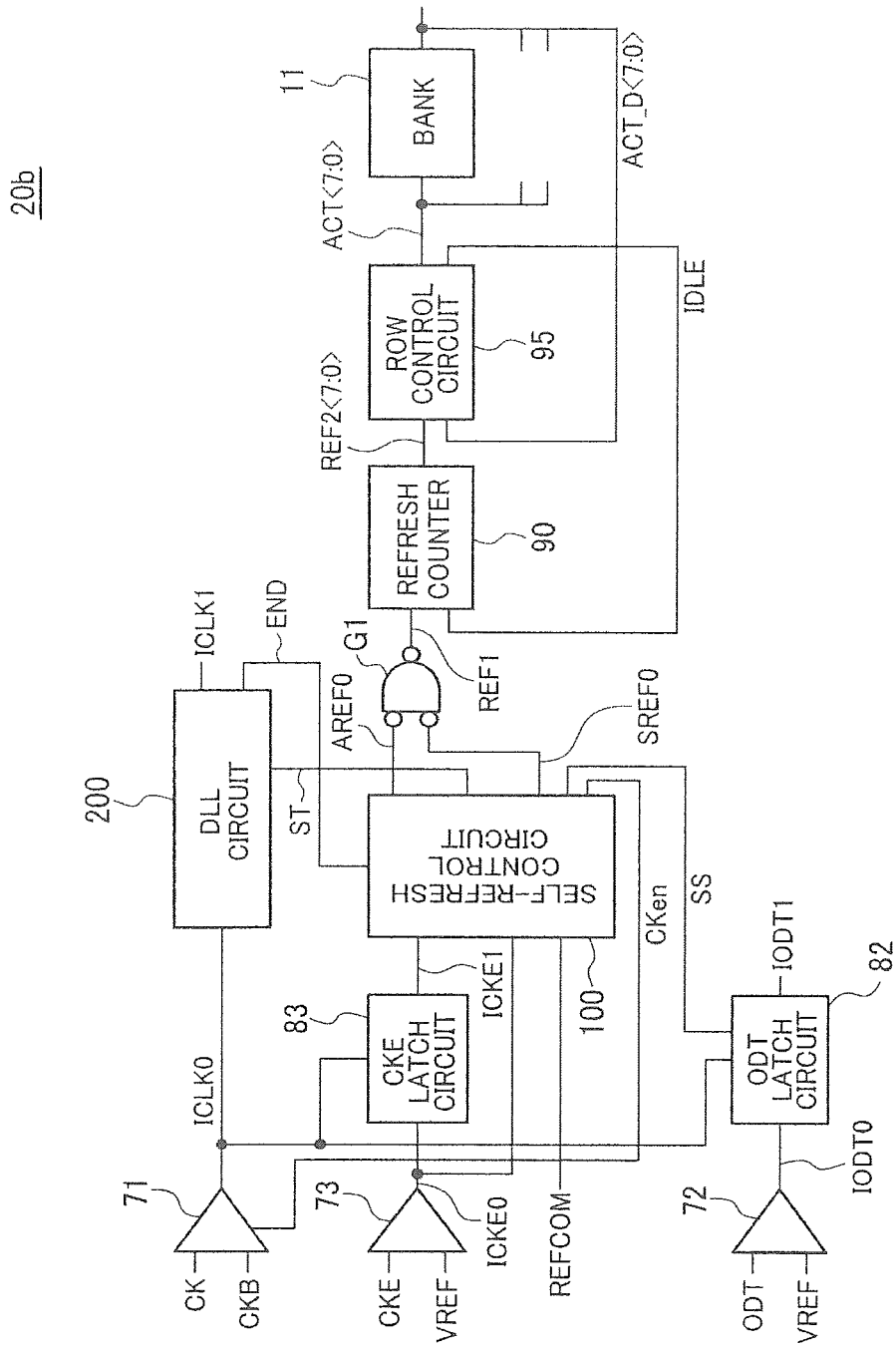
FIG. 15 is a block diagram indicative of an embodiment of main circuit blocks included in an access control circuit 20h according to a third embodiment.

Turning to FIG. 15, the access control circuit 20b uses a self-refresh control circuit 100b instead of the self-refresh control circuit 100. The self-refresh control circuit 100b supplies an update start signal ST to the DLL circuit 200 and receives an update end signal END output from the DLL circuit 200. Other features of the access control circuit 20a are basically the same as those of the access control circuit 20 shown in FIG. 3, and therefore like elements are denoted by like reference characters and redundant explanations thereof will be omitted.

Turning to FIG. 16, the self-refresh control circuit 100b is different from the self-refresh control circuit 100 shown in FIG. 6 in that an SR latch circuit L2 is used instead of the one-shot pulse generating circuit OP1 and that a NAND gate circuit G0 that receives outputs from the SR latch circuits L1 and L2 is added. The output from the SR latch circuit L1 is used as the self-state signal SS and an output from the NAND gate circuit G0 is used as the enable signal CKen. Other features of the self-refresh control circuit 100a are basically the same as those of the self-refresh control circuit 100 shown in FIG. 6, and therefore like elements are denoted by like reference characters and redundant explanations thereof will be omitted.

A signal indicating a negative AND of the self-state signal SS and the self-refresh signal SREF0 is input to the set node S of the SR latch circuit L2. An inverse signal of the update end signal END is input to the reset node R of the SR latch circuit L2. This causes the SR latch circuit L2 to be set each time the self-refresh signal SREF0 is activated and to be reset each time the update end signal END is activated in a state where the semiconductor device has entered the self-refresh mode.

A signal indicating an AND of the self-state signal SS and the self-refresh signal SREF0 is used as the update start signal ST. The update start signal ST is supplied to the DLL circuit 200 shown in FIG. 15.

Furthermore, outputs of the SR latch circuits L1 and L2 are supplied to a NAND gate circuit G0, and an output thereof is used as the enable signal CKen. Therefore, the enable signal CKen has a low level when the SR latch circuit L1 is set and the SR latch circuit L2 is reset. In other states, the enable signal CKen is always activated to a high level.

Figure 17:
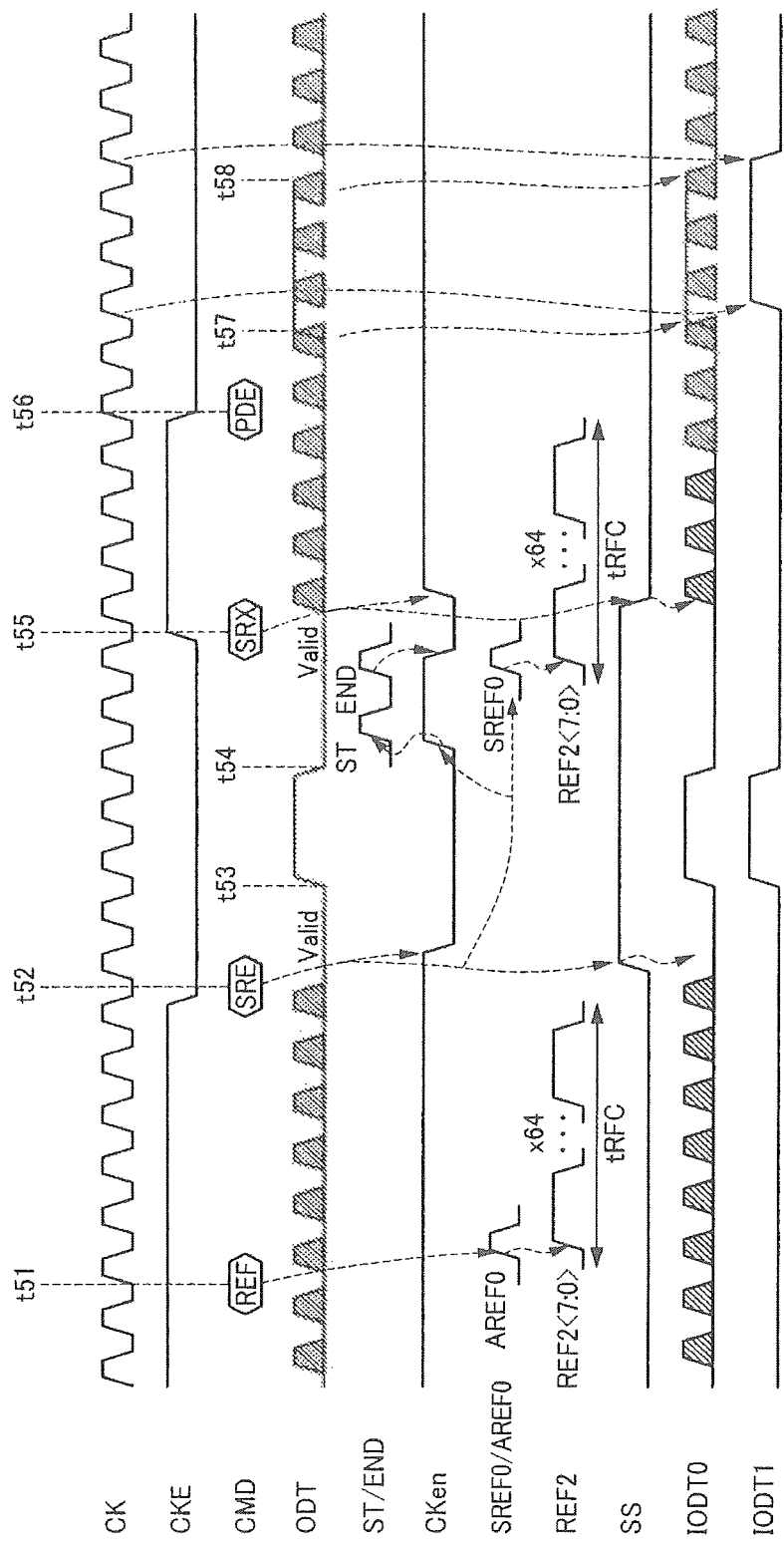
FIG. 17 is a timing chart for explaining an operation of the access control circuit 20b shown in FIG. 15.

Turning to FIG. 17, the auto-refresh command REF is issued at a time t51, the self-refresh command SRE is issued at a time t52, the self-refresh exit command SRX is issued at a time t55, and the power-down command PDE is issued at a time t56. Therefore, the semiconductor device 10 is in the self-refresh mode during a period of time from t52 to t55 and the semiconductor device 10 is in the power-down mode during after the time t56.

When the auto-refresh command REF is issued at the time t51 in this state, the auto refresh signal AREF0 is activated. An operation performed in this case is as explained with reference to FIG. 8.

When the self-refresh command SRE is issued at the time t52, the SR latch circuit L1 shown in FIG. 16 is set and the self-state signal SS is changed to a high level. Accordingly, the CDT latch circuit 82 outputs the impedance control signal IODT0 as it is as the impedance control signal IODT1. Furthermore, the enable signal CKen is changed to a low level because the SR latch circuit L2 is reset. This inactivates the input buffer circuit 71 shown in FIG. 11, thereby reducing power consumption.

When the semiconductor device enters the self-refresh mode, the oscillator 150 periodically outputs the refresh signal SREF0. When the refresh signal SREF0 is activated, the access control circuit 20a performs the same operation as the case where it is operating in the second operation mode in the first embodiment. That is, a total of 64 word lines are selected one after another. Furthermore, when the refresh signal SREF0 is activated, the SR latch circuit L2 shown in FIG. 16 is set and thus the enable signal CKen is changed to a high level. This activates the input buffer circuit 71 shown in FIG. 15, thereby enabling reception of the external clock signal CR. Because the update start signal ST is also activated, DLL circuit 200 generates the internal clock signal ICLK1 phase-controlled, based on the internal clock signal ICLK0 output from the input buffer circuit 71. That is, the update operation of the DLL circuit 200 is performed.

When the update operation of the DLL circuit 200 ends, the DLL circuit 200 outputs the update end signal END and then the SR latch circuit L2 is reset. This causes the enable signal CKen to be changed to the low level again, thereby inactivating the input buffer circuit 71. Therefore, power consumption of the input buffer circuit 71 can be reduced during periods other than an update time of the DLL circuit performing self refresh. At that time, the counter circuit 220 is not reset and transits to an inactive state with a count value at the time of generation of the update end signal END kept.

While the refresh signal SREF0 is activated once in FIG. 17, the refresh signal SREF0 is periodically generated by the oscillator 150 during a period when the semiconductor device has entered the self-refresh mode. Accordingly, the input buffer circuit 71 and the DLL circuit 200 are activated each time the refresh signal SREF0 is generated. In this way, because the input buffer circuit 71 and the DLL circuit 200 are intermittently activated even when the semiconductor device has entered the self-refresh mode, the DLL circuit 200 can keep locked state (a state where the internal clock signal ICLK0 and the internal clock signal RCLK have phases almost matched). In addition, because the input buffer circuit 71 and the DLL circuit 200 are not always activated but intermittently activated based on the refresh signal SREF0 during the self-refresh mode and are inactivated during other periods, useless power consumption can be avoided.

When the semiconductor device enters the self-refresh mode, as is the case with the first embodiment, the impedance control signal ODT supplied from the controller is introduced as it is as the impedance control signal IODT1. That is, the impedance control signal IODT1 is introduced independently of the external clock signals CK and CKB. In an example shown in FIG. 17, the impedance control signal ODT is activated to a high level during a period of time from t53 to t54 and is internally used as it is as the impedance control signal IODT1.

When the self-refresh exit command SRX is issued at the time t55, the SR latch circuit L1 shown in FIG. 16 is reset, the self-state signal SS is changed to the low level, and the enable signal CKen is changed to the high level. This activates the input buffer circuit 71 and enables input of the external clock signal Cr.

At that time, the DLL circuit 200 is already in the locked state and thus the controller can issue the command for controlling a state of the data terminal in synchronism with the internal clock signal ICLK1, that is, the second command in a short time. In the third embodiment, the DLL circuit 200 is not reset in response to the self-refresh exit command SRX. A minimum period after the self-refresh exit command SRX is issued and before the second command can be issued is 24 nanoseconds (ns), for example. That is, issuance of the second command B is allowed 24 ns after the self-refresh exit command SRX is issued.

On the other hand, a minimum period after the self-refresh exit command SRX is issued and before the first command can be input is the same as that in the case that the access control circuit 20a operates in the second operation mode. A minimum period after the controller issues the self-refresh exit command SRX and before the first command A can be issued is tRFC+10 ns, for example. That is, issuance of the first command is allowed when tRFC+10 ns have passed from issuance of the self-refresh exit command SRX.

As described above, according to the second embodiment, in addition to the effect of the first embodiment, the input buffer circuit 71 and the DLL circuit 200 are intermittently activated in conjunction with each other and therefore the locked state of the DLL circuit 200 can be maintained during a period when the semiconductor device has entered the self-refresh mode. This enables issuance of the second command at a short time after the self-refresh exit command SRX is issued. In addition, the input buffer circuit 71 and the DLL circuit 200 are not always activated but intermittently activated in conjunction with each other based on the refresh signal SREF0, and are inactivated during other periods. Accordingly, increase in the power consumption can be minimized.

Also the operation of the third embodiment is not specified in the DRAM standards and thus it is desirable to use a configuration that enables switching between the operation of the third embodiment and the operation specified in the standards. That is, it suffices to design a circuit to perform the operation complying with the DRAM standards in the first operation mode and perform the operation of the third embodiment mentioned above in the second operation mode. The first operation mode is as already explained.

The fourth embodiment of the present invention is explained next.

An access control circuit according to the fourth embodiment has a configuration in which the self-refresh control circuit 100b is replaced by a self-refresh control circuit 100c. Other features of the access control circuit of the fourth embodiment are basically the same as those of the access control circuit 20b shown in FIG. 15.

Figure 18:
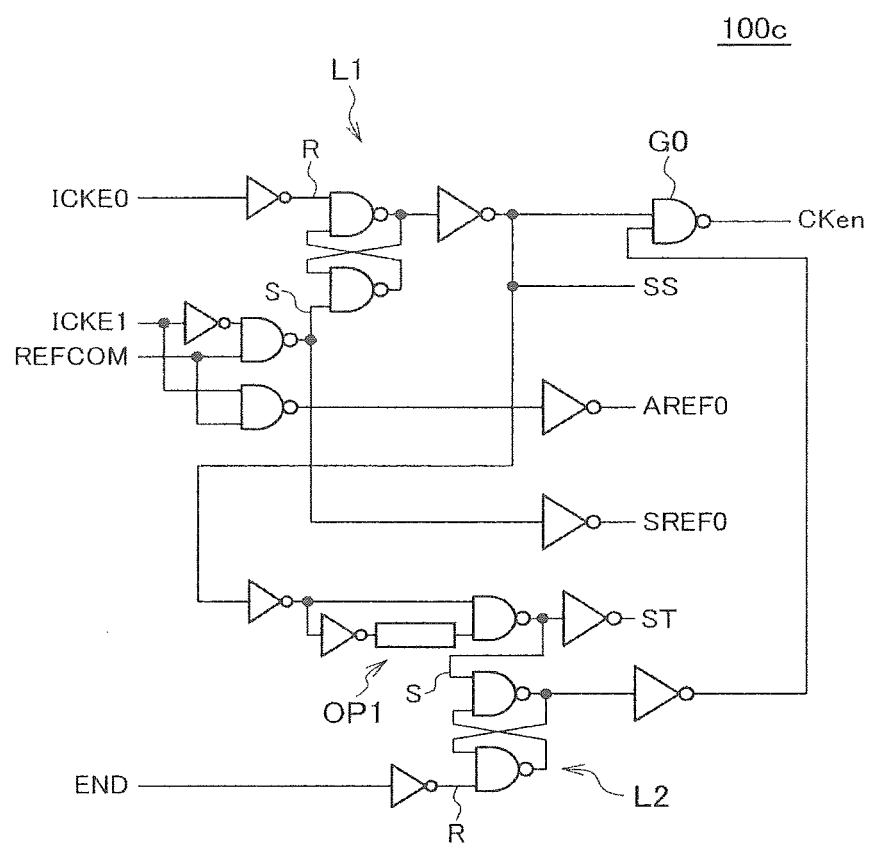
FIG. 18 is a main circuit diagram indicative of an embodiment of a self-refresh control circuit 100c included in an access control circuit according to a fourth embodiment.

Turning to FIG. 18, the self-refresh control circuit 100c is different from the self-refresh control circuit 100b shown in FIG. 16 in that the one-shot pulse generating circuit OP1 is used instead of the oscillator 150. A signal supplied to the set node S of the SR latch circuit L1 is used as it is as the self-refresh signal SREF0. Output from the one-shot pulse generating circuit OP1 is used as the update start signal ST. Other features of the self-refresh control circuit 100a are basically the same as those of the self-refresh control circuit 100b shown in FIG. 16, and therefore like elements are denoted by like reference characters and redundant explanations thereof will be omitted.

With this configuration, the self refresh signal SREFR0 is activated and refresh operation is performed once each time the self-refresh command. SRE is issued. The update operation of the DLL circuit 200 is started.

An output of the one-shot pulse generating circuit OP1 is supplied to the set node S of the SR latch circuit L2. An inverse signal of the update end signal END is input to the reset node R of the SR latch circuit L2. This causes the SR latch circuit L2 to be set each time the self-refresh exit signal SRX is issued. Furthermore, outputs of the SR latch circuits L1 and L2 are supplied to a NAND gate circuit G0, and an output thereof is used as the enable signal CKen. Therefore, the enable signal CKen has a low level when the SR latch circuit L1 is set and the SR latch circuit L2 is reset. In other states, the enable signal CKen is always activated to a high level.

Figure 19:
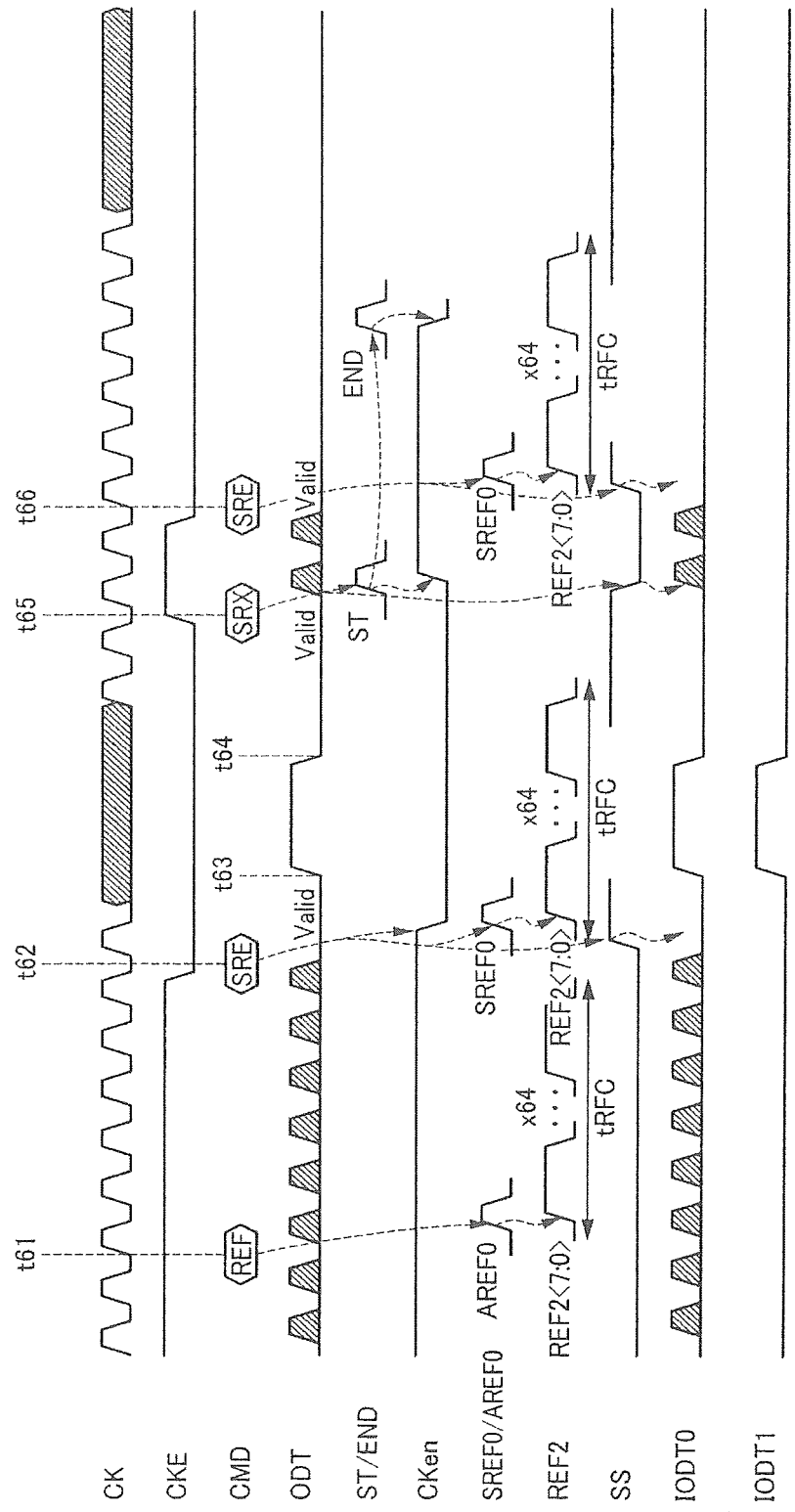
FIG. 19 is a timing chart for explaining an operation of the access control circuit according to the fourth embodiment.

Turning to FIG. 19, the auto-refresh command REF is issued at a time t61, the self-refresh command SRE is issued at a time t62, the self-refresh exit command SRX is issued at a time t65, and the self-refresh command SRE is issued again at a time t66. Therefore, the semiconductor device 10 is in the self-refresh mode during a period of time from t62 to t63 and a period after the time t65, and the semiconductor device 10 is not in the self-refresh mode during other periods. Although not shown in FIG. 19, the self-refresh command SRE and the self-refresh exit command SRX are periodically and alternately issued during a period after the time t62, and such a control is executed when the controller 50 causes the semiconductor device to enter a pseudo self-refresh mode. The pseudo self-refresh mode is an operation mode to realize low power consumption as in the case where a DRAM compliant with the standards has entered the self-refresh mode, by periodically and alternately issuing the self-refresh command SRE and the self-refresh exit command SRX. Accordingly, during a period when the semiconductor device has entered the pseudo self-refresh mode, other commands such as the first and second commands are not issued during a period after the self-refresh exit command SRX is issued and before the next self-refresh command SRE is issued. However, the impedance control signal ODT can be always issued. In the pseudo self-refresh mode, the self-refresh command SRE is issued immediately after issuance of the self-refresh exit command SRX. This feature is fundamentally different from the case of the normal DRAM that returns from the self-refresh mode and then enters the self-refresh mode.

An operation performed during a period before the semiconductor device 10 enters the self-refresh mode is the same as that in the first embodiment. Therefore, when the auto-refresh command REF is issued at the time t61, the row control circuit 95 supplies the active signals ACT<7:0> to each bank eight times. This causes eight word lines to be selected one after another, so that memory cells MC connected to a total of 64 word lines are refreshed.

When the self-refresh command SRE is issued at the time t62, the SR latch circuit L1 shown in FIG. 18 is set and the self-state signal SS is changed to a high level. Accordingly, the OPT latch circuit 82 shown in FIG. 15 outputs the impedance control signal IODT0 as it is as the impedance control signal IODT1. Furthermore, the enable signal CKen is changed to a low level because the SR latch circuit L2 is reset. This inactivates the input buffer circuit 71 shown in FIG. 3, thereby reducing power consumption.

When the self-refresh command SRE is issued, the self-refresh signal SREF0 is immediately activated. When the self-refresh signal SREF0 is activated, the refresh counter 90 performs the same operation as that performed when the auto-refresh signal AREF0 is activated. That is, a total of 64 word lines are selected one after another. In this embodiment, the refresh operation executed in the self-refresh mode is one-time event.

When the semiconductor device enters the self-refresh mode, as is the case with the first embodiment, the impedance control signal CDT supplied from the controller is introduced as it is as the impedance control signal IODT1. That is, the impedance control signal IODT1 is introduced independently of the external clock signals CR and CKB. In an example shown in FIG. 19, the impedance control signal CDT is activated to a high level during a period of time from t63 to t64 and is internally used as it is as the impedance control signal IODT1.

When the self-refresh exit command SRX is issued at the time t65, the SR latch circuit L1 shown in FIG. 18 is reset, the self-state signal SS is changed to the low level, and the enable signal CKen is changed to the high level. This activates the input buffer circuit 71 and enables input of the external clock signal CK.

Furthermore, an update start signal ST is output from the one-shot pulse generating circuit OP1 in response to change of the self-state signal SS to a low level. Accordingly, the DLL circuit 200 generates the internal clock signal ICLK1 phase-controlled, based on the internal clock signal ICLK0 output from the input buffer circuit 71. That is, the update operation of the DLL circuit 200 is performed. When the update operation of the DLL circuit 200 is finished, an update end signal END is output from the DLL circuit 200, thereby resetting the SR latch circuit L2. It is desirable that a timing when the controller 50 resumes issuance of the external clock signal CK be before a time t65. This is because the update operation of the DLL circuit 200 is performed immediately in response to the self-refresh exit command ERR in the present embodiment.

In the example shown in FIG. 19, the self refresh command SRE is issued again during a period when the update operation of the DLL circuit 200 is performed, that is, a period after the update start signal ST is activated and before the update end signal END is activated (a time t66). This causes the SR latch circuit L1 to be set again. However, because the SR latch circuit L2 is already set at that time, the enable signal CKen keeps a high level. When the update end signal END is output and accordingly the SR latch circuit L2 is reset, the enable signal CKen is changed to a low level, thereby inactivating the input buffer circuit 71.

This operation, that is, an operation of alternately issuing the self-refresh command SRE and the self-refresh exit command SRX is repeatedly performed during a period when the controller 50 causes the semiconductor device to enter the pseudo self-refresh mode mentioned above. When an issuance period of the self-refresh command SRE is matched with a performing period of the refresh operation in the self-refresh mode of the normal DRAM (about 7.8 µs), all memory cells MC can be refreshed within a unit period (64 ms in the standards). This means it suffices that the number of the self-refresh commands SRE issued in each unit period is matched with the number of the auto-refresh commands REF issued in each unit period.

As described above, because the refresh operation is performed only once, in response to the self-refresh command SRE in the present embodiment, a state where no refresh operation is performed is ensured at a time when the self-refresh exit command SRX is issued after the refresh period tRFC has passed from issuance of the self-refresh command SRE. Accordingly, issuance of the first command is enabled a short time after issuance of the self-refresh exit command SRX. Furthermore, because the update operation of the DLL circuit 200 is performed in response to the self-refresh exit command SRX, a state where the DLL circuit 20 is locked is maintained also during the pseudo self-refresh mode. Therefore, the second command using the internal clock signal ICLK1 can be issued a short time after issuance of the self-refresh exit command SRX.

Figure 20:
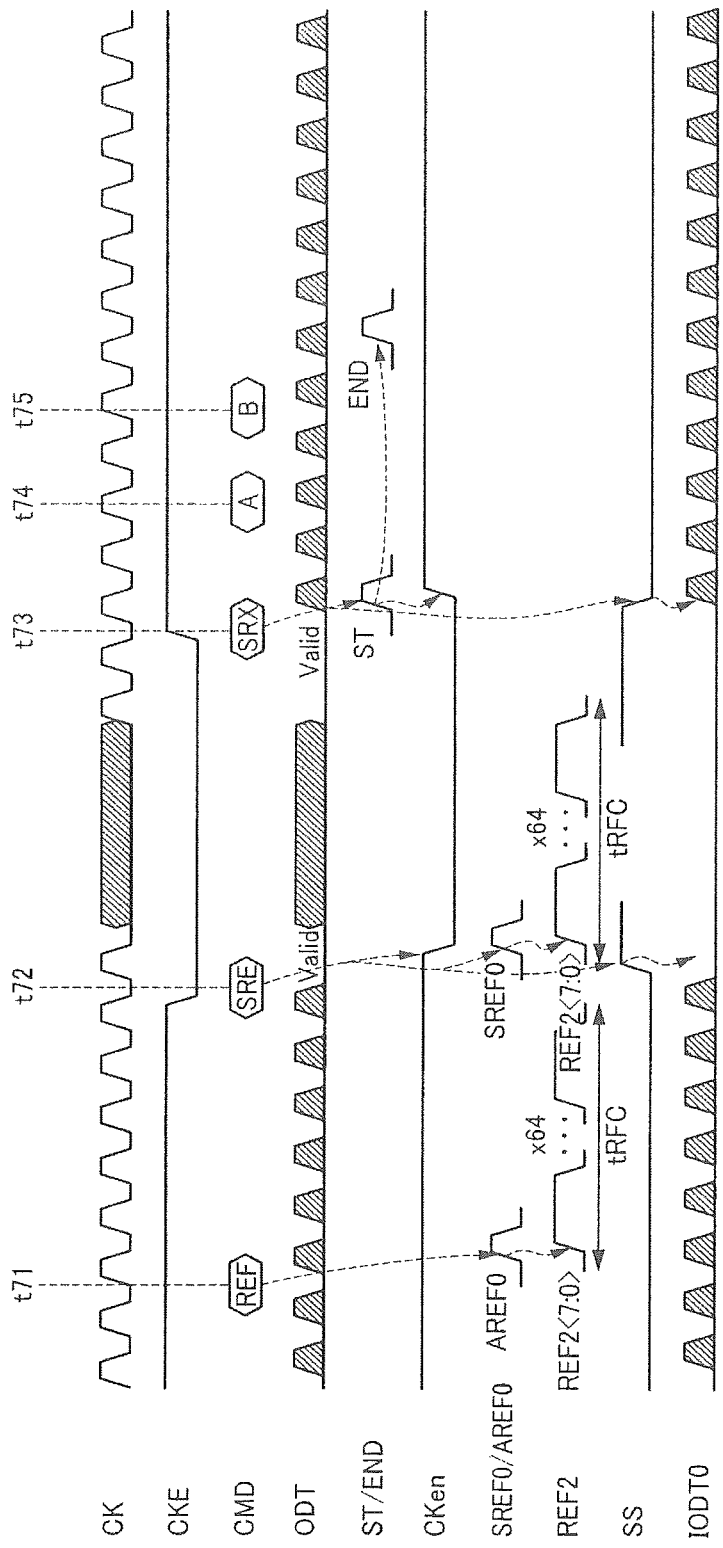
FIG. 20 is a timing chart for explaining advantages according to the fourth embodiment.

Turning to FIG. 20, the auto-refresh command REF is issued at a time t71, the self-refresh command SRE is issued at a time t72, the self-refresh exit command SRX is issued at a time t73, a first command A is issued at a time t74, and a second command B is issued at a time t75. The operation when the self-refresh command SRE and the self-refresh exit command SRX are issued is described above, therefore redundant explanation is omitted.

As shown in FIG. 20, a minimum period after the self-refresh exit command SRX is issued and before the first command A can be issued is greatly reduced as compared to the common DRAM and is 7.5 ns, for example. That is, issuance of the first command A is allowed when 7.5 ns have passed from issuance of the self-refresh exit command SRX. This is because a state where no refresh operation is performed is ensured at a time when the self-refresh command SRX is issued, as described above.

Also a minimum period after the self-refresh exit command SRX is issued and before the second command B can be issued is greatly reduced as compared to the common DRAM and is 24 ns, for example. That is, issuance of the second command B is allowed when 24 ns have passed from issuance of the self-refresh exit command SRX.

Figure 21:
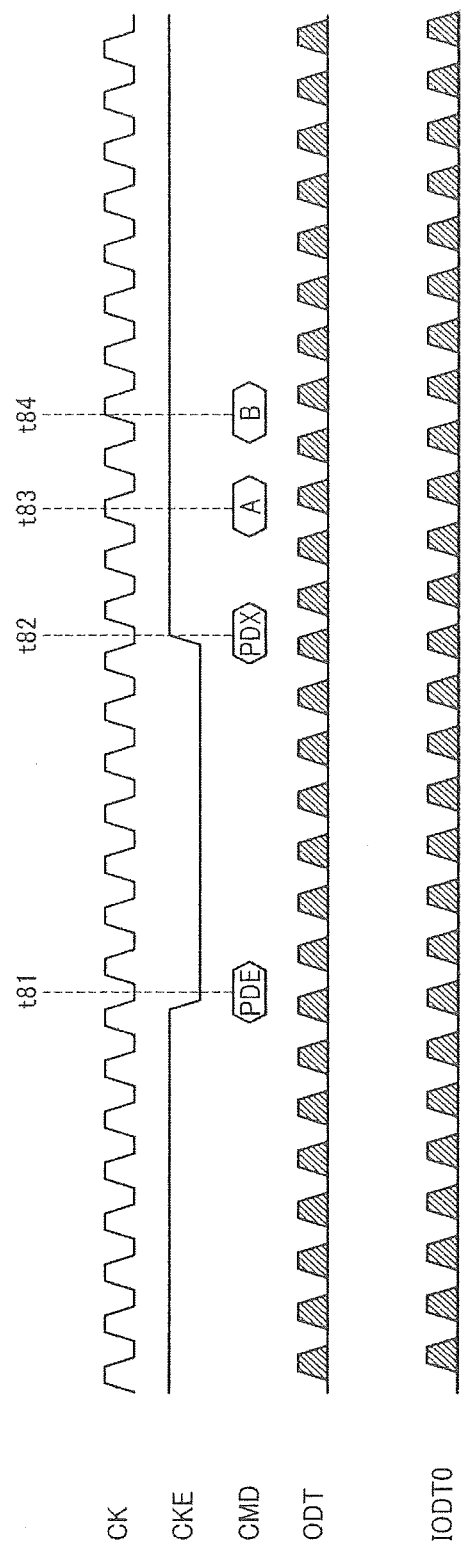
FIG. 21 is another timing chart for explaining an operation of the access control circuit according to the fourth embodiment.

Turning to FIG. 21, the power-down command PDE is issued at a time t81, the power-down exit command PDX is issued at a time t82, the first command A is issued at a time t83, and the second command B is issued at a time t84. Therefore, the semiconductor device 10 is in a power-down mode during a period of time from t81 to t82.

A minimum period after the power-down exit command PDX is issued and before the first command A can be issued is equal to a minimum period after the self-refresh exit command SRX is issued and before the first command A can be issued. That is, issuance of the first command A is allowed when, for example, 7.5 no have passed after issuance of the power-down exit command PDX. This is, as mentioned above, because no refresh operation is performed in the power-down mode and thus a state where no refresh operation is performed is ensured at a time when the power-down exit command PDX is issued.

A minimum period after the power-down exit command PDX is issued and before the second command B can be issued is equal to a minimum period after the self-refresh exit command SRX is issued and before the second command B can be issued. That is, issuance of the second command B is allowed when, for example, 24 ns have passed after issuance of the power-down exit command PDX. This is because the external clock signal CK is input in the power-down mode and thus the update operation of the DLL circuit 200 can be performed, which enables the DLL circuit 200 to be kept in a locked state.

As described above, according to the fourth embodiment, the effect of the first embodiment mentioned above is obtained and also the minimum input times of the first or second command after exit in the self-refresh mode and the power-down mode are the same. This means that the conventional problem that a recovery time from the self-refresh mode is long is solved. Also the operation of the fourth embodiment is not specified in the DRAM standards and thus it is desirable to use a configuration that enables switching between the operation of the fourth embodiment and the operation specified in the standards. That is, it suffices to design a circuit to perform the operation complying with the DRAM standards in the first operation mode and perform the operation of the fourth embodiment mentioned above in the second operation mode. The first operation mode is as already explained.

In the first operation mode, the input buffer circuit 71 is always kept in an inactive state during the period when the semiconductor device has entered the self-refresh mode. Accordingly, the controller does not supply the external clock signals CK and CKB. This enables reduction in power consumption of the system. In the first operation mode, the external clock signals OK and CKB are not supplied to the semiconductor device and thus the DLL circuit 200 is also kept in an inactive state. Accordingly, power consumption during the period when the semiconductor device has entered the self-refresh mode in the first operation mode is reduced more than in that in the second operation mode. Because the input buffer circuit 72a is inactivated during the period when the semiconductor device has entered the self-refresh mode, the impedance control signal OPT cannot be input during this period. This means that, in a system that commonly uses data terminals of a plurality of semiconductor devices (that is, a configuration in which the data terminals of the semiconductor devices are commonly connected to a data bus of the system), when a controller causes one of the semiconductor devices to enter the self-refresh mode, for example, an impedance of the data terminal thereof cannot be adjusted and thus the write command WT cannot be issued to the other semiconductor device. This is because prevention of data reflection is essential in a system to which high frequency data are transferred. On the other hand, in a power-down mode, impedance adjustment of the data terminal can be performed during that period. Therefore, in this case, the controller selects the power-down mode in the first operation mode, instead of the self-refresh mode in which power consumption is low. From this viewpoint, accordingly, impedance adjustment of the data terminal can be performed during the self-refresh mode is desirable.

An information processing system according to an embodiment of the present invention is explained next.

Figure 22:
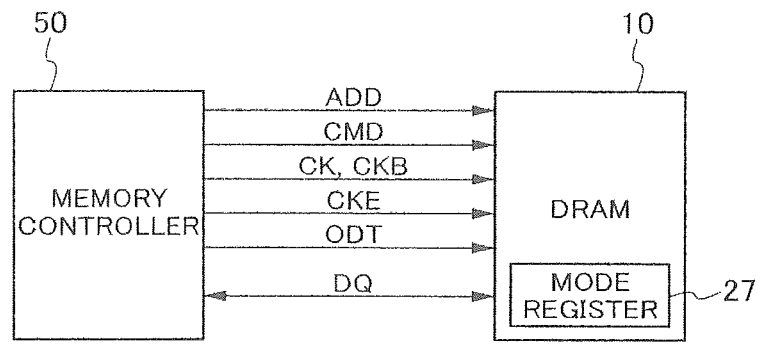
FIG. 22 is a block diagram indicative of a first preferred embodiment of an information processing system according to the present invention.

Turning to FIG. 22, the information processing system has a configuration in which one controller 50 and one semiconductor device (DRAM) 10 are used and are connected with each other. The controller 50 supplies the address signal ADD, the command signal CMD, the external clock signals CK and CKB, the clock enable signal CKE, and the impedance control signal CDT to the semiconductor device 10. The controller 50 sets the semiconductor device 10 to the first or second operation mode. When having set the semiconductor device 10 to the first operation mode, the controller 50 issues the command signal CMD and the like according to the DRAM standards. On the other hand, when having set the semiconductor device 10 to the second operation mode, the controller 50 issues the command signal CMD and the like at a timing not compliant with the DRAM standards, thereby realizing the operations explained in the first to fourth embodiments.

Selection of an operation mode can be performed by setting the operation mode in a mode register 27 included in the semiconductor device 10. Setting to the mode register 27 is performed by a method of issuing a mode-register set command (MRS) and inputting an operation mode to be set through the address terminal 21. According to this method, the first or second operation mode is selected at the time of initialization of the semiconductor device 10.

However, selection of an operation mode is not limited thereto and the first or second operation mode can be selected by a so-called on-the-fly method. That is, an additional signal that specifies the first or second operation mode can be issued using the address terminal 21 or the data terminal 31 when the self-refresh command SRE is issued, thereby selecting the first or second operation mode each time the semiconductor device enters the self-refresh mode.

Figure 23:
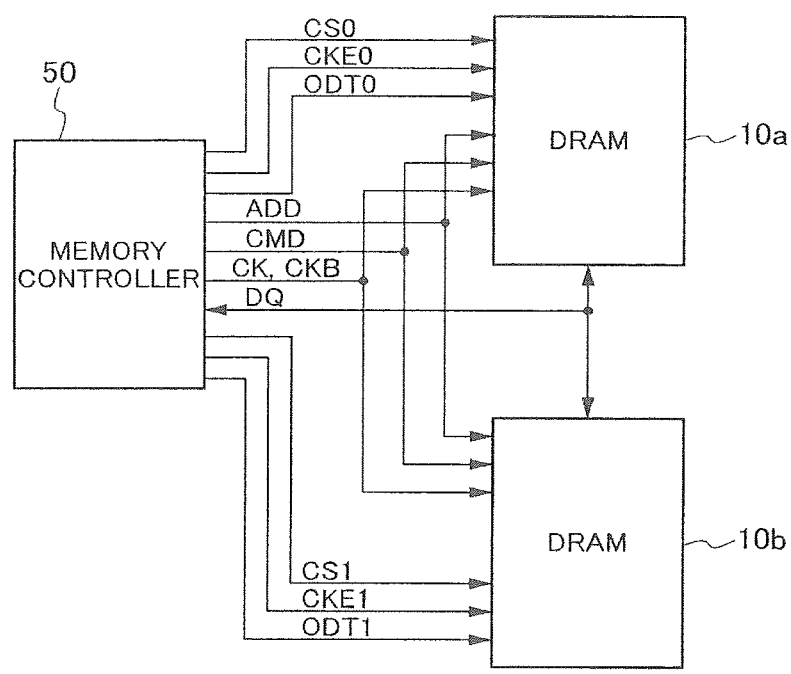
FIG. 23 is a block diagram indicative of a second preferred embodiment of an information processing system according to the present invention.

Turning to FIG. 23, two semiconductor devices (DRAMs) 10a and 10b are connected to one controller 50. The address signal ADD, the command signal CMD, the external clock signals CK and CKB from the controller 50 are commonly supplied to the two semiconductor devices 10a and 10b. The data terminals 31 of the semiconductor devices 10a and 10b are also commonly connected to the controller 50. On the other hand, the clock enable signal CKE and the impedance control signal ODT are separately supplied to the semiconductor devices 10a and 10b. That is, a clock enable signal CKE0 and an impedance control signal ODT0 are supplied to the semiconductor device 10a and a clock enable signal CKE1 and an impedance control signal ODT1 are supplied to the semiconductor device 10b. Selection of the semiconductor device 10a or 10b is performed by a chip select signal CS0 or CS1. That is, the command signal CMD or the like issued from the controller 50 becomes valid only for the semiconductor device 10a or 10b to which the chip select signal is activated.

Figure 24:
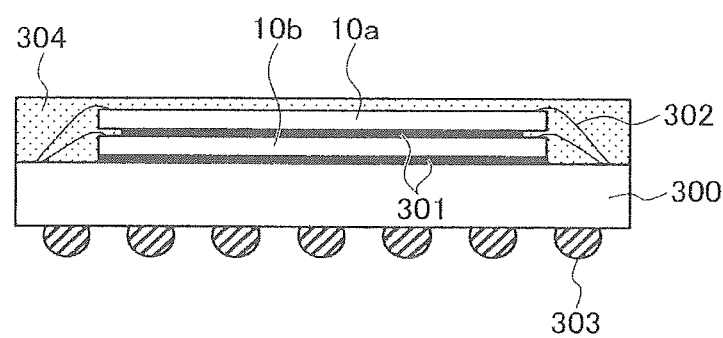
FIG. 24 is a schematic cross-sectional view for explaining a configuration of a dual-die package DDP, which is a package having two semiconductor devices 10a and 10b.
Figure 25:
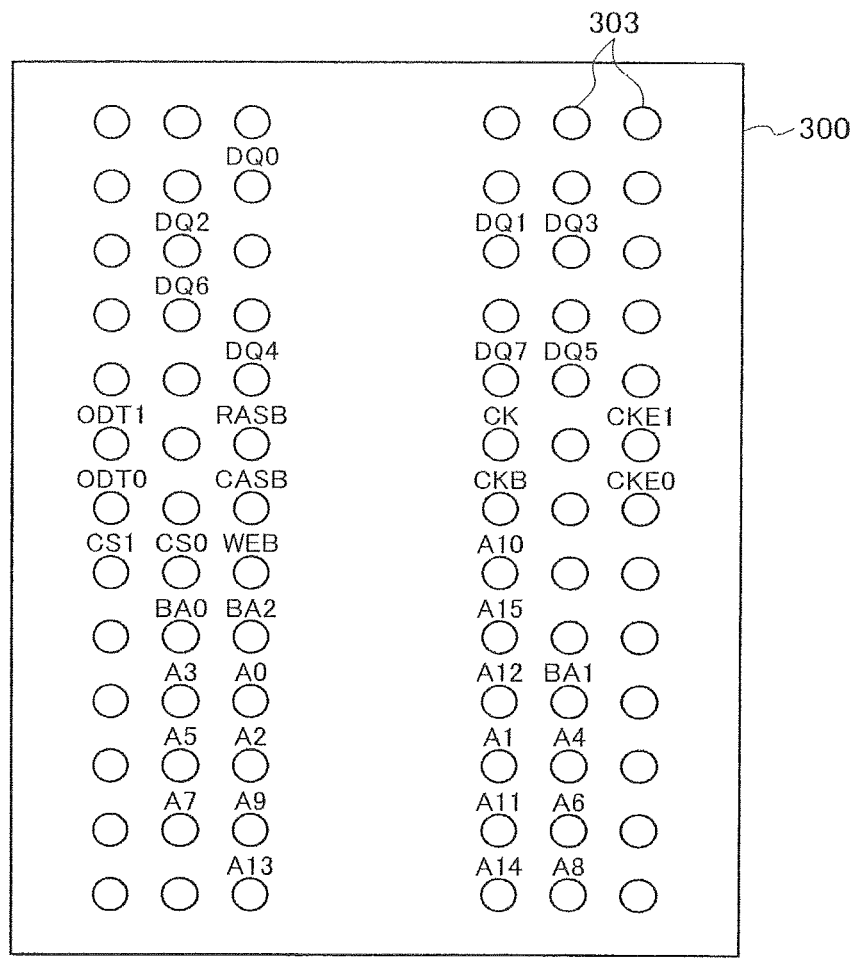
FIG. 25 is a schematic plan view showing an example of a layout of the external terminals 303 provided on the dual-die package DDP.

Turning to FIG. 24, the dual-die package DDP having a configuration in which the two semiconductor devices 10a and 10b are stacked on a package substrate 300 is shown. Between the semiconductor devices 10a and 10b and between the semiconductor device 10b and the package substrate 300, an adhesive 301 is interposed, which fixes the semiconductor devices 10a and 10b and the semiconductor device 10b and the package substrate 300 to each other. The semiconductor devices 10a and 10b and the package substrate 300 are connected with a bonding wire 302, which electrically connects the semiconductor devices 10a and 10b to external terminals 303 through an internal wire (not shown) provided in the package substrate 300. A sealing resin 304 is provided on the package substrate 300 to protect the semiconductor devices 10a and 10b and the bonding wire 302.

Figure 26:
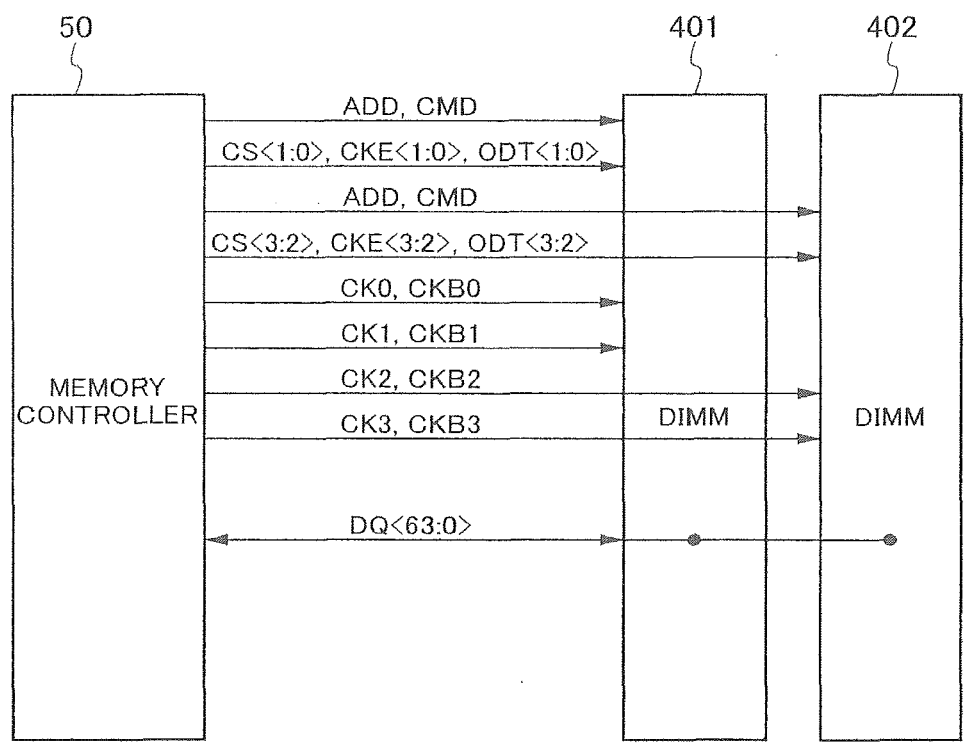
FIG. 26 is a block diagram indicative of the third embodiment of an information processing system according to the present invention.

Turning to FIG. 26, the external terminals 303 are laid out in a matrix on the dual-die packaged DDP. Among these terminals, those related to the address signal ADD, the command signal CMD, the external clock signals CK and CKB, and data DQ are provided commonly for the semiconductor devices 10a and 10b. On the other hand, those related to the clock enable signal CKE, the impedance control signal CDT, and the chip select signal CS are provided separately for the semiconductor devices 10a and 10b. Therefore, even when only one of the semiconductor devices 10a and 10b has entered the self-refresh mode, the external clock signals CK and CKB are continuously supplied to both of the semiconductor devices 10a and 10b. Accordingly, it can be said that this configuration has high compatibility with the third embodiment mentioned above.

For example, when the semiconductor device 10a has entered the self-refresh mode and the semiconductor device 10b has not entered the self-refresh mode, the DLL circuit 200 and the input buffer circuit 71 of the semiconductor device 10a are intermittently activated during the self-refresh mode by utilizing the external clock signals CK and CKB continuously supplied also to the semiconductor device 10a, so that the locked state of the DLL, circuit 200 can be maintained. Because input of the impedance control signal ODT is possible even in the self-refresh mode in the first to fourth embodiment, the impedance control signal ODT0 or ODT1 can be set to a high level, thereby performing an impedance control of the output buffer circuit 30a, even when both of the semiconductor devices 10a and 10b have entered the self-refresh mode.

Turning to FIG. 26, two DIMMs (Dual Inline Memory Modules) 401 and 402 are connected to one controller 50. For example, 16 semiconductor devices (DRAMs) 10 are mounted on each of the DIMMs 401 and 402. Each of the DIMMs 401 and 402 has a two-rank configuration and accordingly there are four ranks in total. One rank is composed of eight semiconductor devices 10, for example, which are arranged on one of surfaces of a module substrate although not particularly limited thereto. A rank is exclusively selected by chip select signals CS0 to CS3.

The address signal ADD and the command signal CMD from the controller 50 are supplied to each of the DIMMs 401 and 402. On the other hand, the external clock signals CK and CKB are supplied to each rank. The data terminals 31 are commonly supplied to the controller 50 in the four ranks.

Turning to FIGS. 27A to 27C, when a write operation is performed for the DIMM 401, one of the ranks (the rank 1 in FIG. 27A) in the DIMM 401 is terminated to 120 ohms (Ω) and one of the ranks (the rank 2 in FIG. 27A) in the DIMM 402 is terminated to 30Ω as shown in FIG. 27A. When a write operation is performed for the DIMM 402, one of the ranks (the rank 2 in FIG. 27B) in the DIMM 401 is terminated to 30Ω and one of the ranks (the rank 1 in FIG. 27A) in the DIMM 402 is terminated to 120Ω as shown in FIG. 27B.

As shown in FIG. 27C, when a read operation is performed for the DIMM 401, one of the ranks (the rank 2 in FIG. 27C) in the DIMM 402 is terminated to 30Ω. When a read operation is performed for the DIMM 402, one of the ranks (the rank 2 in FIG. 27D) in the DIMM 401 is terminated to 30Ω as shown in FIG. 27D.

In this example, even when one of the DIMMs 401 and 402 is to be accessed, the other one of the DIMMs 401 and 402 needs to be functioned as a terminating resistor. Such a control is particularly required when an operating frequency is high. When this control is required, ranks that do not need to be accessed can be entered into the self-refresh mode in which power consumption is much lower than in the power-down mode by using the semiconductor device according to the first to fourth embodiments. That is, in the semiconductor device according to the first to fourth embodiments, the impedance control signal OPT can be input even when the semiconductor devices has entered the self-refresh mode and thus a desired terminating resistance can be obtained by outputting the impedance control signal OPT from the controller 50 in synchronism with a read operation or a write operation for another rank.

It is apparent that the present invention is not limited to the above embodiments, but may be modified and changed without departing from the scope and spirit of the invention.

For example, while the number of memory cells to be refreshed in response to the self-refresh command SRE is a quarter of that of memory cells to be refreshed in response to the auto-refresh command REF in the above embodiments, the present invention is not limited thereto.

Furthermore, a PLL circuit can be used instead of the DLL circuit. The controller 50 can have functions other than that of controlling a memory.

The technical concept of the present invention can be applied to a semiconductor device having various functional chips, a controller thereof, and a system thereof. Furthermore, the configuration of each circuit disclosed in the drawings is not limited to the circuit form disclosed in the above embodiments.

The technical concept of the system of the present invention may be applied to various semiconductor devices. For example, the present invention can be applied to a general system including a CPU (Central Processing Unit), an MCU (Micro Control Unit) a DSP (Digital Signal Processor), an ASIC (Application Specific Integrated Circuit), and an ASSP (Application Specific Standard Product), a Memory and the like. An SOC (System on Chip), an MCP (Multi Chip Package), and a POP (Package on Package) and so on, and a module on which they are applied are pointed to as examples of types of system to which the present invention is applied. The present invention can be applied to the system that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following controllers, control methods thereof, control methods of an information processing system, and semiconductor devices:

A1. A controller comprising:
a command issuing unit that issues commands to a semiconductor device having a self-refresh mode in which a refresh operation of storage data in memory cell array is performed; and a data processor that processes the storage data transmitted to or received from the semiconductor device through a data terminal included therein, wherein the command issuing unit comprises:

an impedance control command issuing unit that issues an impedance control command to control an impedance of the data terminal; and a sub-command issuing unit that issues a self-refresh command that causes the semiconductor device to enter the self-refresh mode, a self-refresh exit command that causes the semiconductor device to exit the self-refresh mode, and an auto-refresh command that causes the semiconductor device to perform the refresh operation, and the impedance control command issuing unit issues the impedance control command to the semiconductor device while the semiconductor device is in the self-refresh mode so that the semiconductor device controls an impedance of the data terminal during the self-refresh mode.

A2. The controller as A1, further comprising a clock issuing unit that issues a clock signal having a predetermined frequency, wherein the impedance control command issuing unit issues the impedance control command to the semiconductor device asynchronously with the clock signal while the semiconductor device is in the self-refresh mode.

A3. The controller as A2, wherein the impedance control command issuing unit issues the impedance, control command to the semiconductor device synchronously with the clock signal while the semiconductor device is in other than the self-refresh mode.

A4. The controller as any one of A1 to A3, further comprising a clock issuing unit that issues a clock signal having a predetermined frequency, wherein the clock issuing unit issues the clock signal to first and second semiconductor devices in common.

A5. The controller as any one of A1 to A3, wherein the impedance control command issuing unit issues the impedance control command to first and second semiconductor devices in common.

A6. The controller as any one of A1 to A3, further comprising a clock issuing unit that issues first and second clock signals having a predetermined frequency, wherein the clock issuing unit selectively issues the first clock signal to a first semiconductor device, the clock issuing unit selectively issues the second clock signal to a second semiconductor device, the impedance control command issuing unit selectively issues a first impedance control command to the first semiconductor device, and the impedance control command issuing unit selectively issues a second impedance control command to the second semiconductor device.

A7. The controller as any one of A1 to A6, wherein the impedance control command issuing unit, in a first operation mode, does not issue the impedance control command to the semiconductor device while the semiconductor device is in the self-refresh mode, and the impedance control command issuing unit, in a second operation mode, issues the impedance control command to the semiconductor device while the semiconductor device is in the self-refresh mode.

A8. The controller as any one of A1 to A6, further comprising a clock issuing unit that issues a clock signal having a predetermined frequency, wherein the clock issuing unit, in a first operation mode, stops issuing the clock signal or changes a frequency thereof while the semiconductor device is in the self-refresh mode, and the clock issuing unit, in a second operation mode, continuously issues the clock signal having the predetermined frequency without stopping the clock signal while the semiconductor device is in the self-refresh mode.

A9. The controller as any one of A1 to A8, wherein the command issuing unit further issues a first command that causes the semiconductor device to perform an access operation to the memory cell array, and a second command that causes the semiconductor device to output the storage data through the data terminal, the command issuing unit issues the second command or the impedance control command after elapse of a first period at earliest from issuing the self-refresh exit command in a first operation mode, and the command issuing unit issues the second command or the impedance control command after elapse of a second period that is shorter than the first period at earliest from issuing the self-refresh exit command in a second operation mode.

A10. The controller as any one of A1 to A9, wherein the sub-command issuing unit further issues a first command that causes the semiconductor device to perform an access operation to the memory cell array, and a second command that causes the semiconductor device to output the storage data through the data terminal, the sub-command issuing unit issues the first command after elapse of a third period at earliest from issuing the self-refresh exit command in a first operation mode, and the sub-command issuing unit issues the first command after elapse of a fourth period that is shorter than the third period at earliest from issuing the self-refresh exit command in a second operation mode.

A11. The controller as any one of A1 to A10, wherein a number of the self-refresh commands issued in each unit period is substantially the same as a number of the auto-refresh commands issued in the each unit period.

A12. The controller as any one of A1 to A11, wherein an interval of issuing the self-refresh commands is substantially the same as that of the auto-refresh commands.

A13. The controller as A11 to A12, wherein the sub-command issuing unit further issues a power-down command that causes the semiconductor device to enter a power-down mode in which the semiconductor device reduces a power consumption thereof, a power-down exit command that causes the semiconductor device to exit the power-down mode, a first command that causes the semiconductor device to perform an access operation to the storage data in the memory cell array, and a second command that causes the semiconductor device to output the storage data through the data terminal, a minimum interval from issuing the self-refresh exit command to issuing the first command is substantially the same as a minimum interval from issuing the power-down exit command to issuing the first command, and a minimum interval from issuing the self-refresh exit command to issuing the second command is substantially the same as a minimum interval from issuing the power-down exit command to issuing the second command.

A14. The controller as any one of A1 to A3, further comprising a clock issuing unit that issues a clock signal having a predetermined frequency, wherein the clock issuing unit stops issuing the clock signal or changes a frequency thereof while the semiconductor device is in the self-refresh mode.

A15. The controller as any one of A7 to A10, wherein the command issuing unit further issues a mode-register set command that brings the semiconductor device into the first or second operation mode.

A16. The controller as any one of A7 to A10, wherein the command further issues an additional signal that brings the semiconductor device into the first or second operation mode along with the self-refresh command.

A17. The controller as A16, further comprising an address processor that specifies an address of the storage data, wherein the address processor issues the additional signal.

A18. A control method of a controller, the method comprising:

issuing a self-refresh command that causes a semiconductor device to enter a self-refresh mode in which a refresh operation on memory cells included in a memory cell array of the semiconductor device is performed;

issuing a self-refresh exit command that causes the semiconductor device to exit the self-refresh mode;

issuing an auto-refresh command that causes the semiconductor device to perform the refresh operation on the memory cells; and issuing an impedance control command to control an impedance of a data terminal of the semiconductor device through which storage data in the memory cell array is output while the semiconductor device is in the self-refresh mode.

A19. The control method of the controller as A18, the method further comprising issuing an external clock signal having a predetermined frequency to the semiconductor device, wherein the controller issues the impedance control command to the semiconductor device asynchronously with the external clock signal while the semiconductor device is in the self-refresh mode.

A20. The control method of the controller as A19, wherein the controller issues the impedance control command to the semiconductor device synchronously with the external clock signal while the semiconductor device is in other than the self-refresh mode.

A21. The control method of the controller as any one of A18 to A20, the method further comprising setting the semiconductor device in first or second operation mode, wherein the controller issues an external clock signal having a predetermined frequency to the semiconductor device while the semiconductor device is in other than the self-refresh mode, the controller, in the first operation mode, stops issuing the external clock signal or changes a frequency thereof while the semiconductor device is in the self-refresh mode, and the controller, in the second operation mode, continuously issues the external clock signal having the predetermined frequency without stopping the external clock signal even while the semiconductor device is in the self-refresh mode.

A22. The control method of the controller as any one of A18 to A21, the method further comprising:

setting the semiconductor device in first or second operation mode;

issuing a first command that causes the semiconductor device to perform an access operation to the memory cell array; and issuing a second command that causes the semiconductor device to output the storage data through the data terminal, wherein the controller issues the second command or the impedance control command after elapse of a first period at earliest from issuing the self-refresh exit command in the first operation mode, and the controller issues the second command or the impedance control command after elapse of a second period that is shorter than the first period at earliest from issuing the self-refresh exit command in the second operation mode.

A23. The control method of the controller as any one of A18 to A20, the method further comprising:

setting the semiconductor device in first or second operation mode;

issuing a first command that causes the semiconductor device to perform an access operation to the memory cell array; and issuing a second command that causes the semiconductor device to output the storage data through the data terminal, wherein the controller issues the first command after elapse of a third period at earliest from issuing the self-refresh exit command in the first operation mode, and the controller issues the first command after elapse of a fourth period that is shorter than the third period at earliest from issuing the self-refresh exit command in the second operation mode.

A24. The control method of the controller as any one of A18 to A23, the method further comprising:

issuing a power-down command that causes the semiconductor device to enter a power-down mode in which the semiconductor device reduces a power consumption thereof;

issuing a power-down exit command that causes the semiconductor device to exit the power-down mode; and issuing a first command that causes the semiconductor device to perform an access operation to storage data in the memory cell array, wherein the controller issues the first command to the semiconductor device after elapse of a fifth period at earliest from issuing the power-down exit command, and the controller issues the first command to the semiconductor device after elapse of a sixth period that is substantially the same time length as the fifth period at earliest from issuing the self-refresh exit command.

A25. The control method of the controller as A24, wherein an interval of issuing the self-refresh commands is substantially the same as that of the auto-refresh commands.

A26. A control method of an information processing system having a controller and a semiconductor device, the method comprising:

issuing, from the controller to the semiconductor device, a self-refresh command, a self-refresh exit command, an auto-refresh command, and an impedance control command;

entering a self-refresh mode in which a refresh operation on memory cells included in a memory cell array of the semiconductor device is performed in response to the self refresh command;

exiting the self-refresh mode in response to the self-refresh exit command;

performing a refresh operation on the memory cells in response to the auto-refresh command; and controlling an impedance of a data terminal through which storage data in the memory cell array is output, wherein the controller issues the impedance control command to the semiconductor device while the semiconductor device is in the self-refresh mode.

A27. The control method of the information processing system as A26, the method further comprising issuing an external clock signal having a predetermined frequency from the controller to the semiconductor device, wherein the semiconductor device performs the refresh operation asynchronously with the external clock signal in response to the impedance control command while the semiconductor device is in the self-refresh mode.

A28. The control method of the information processing system as A27, wherein wherein the controller issues the impedance control command to the semiconductor device while the semiconductor device is in other than the self-refresh mode, and the semiconductor device performs the refresh operation synchronously with the external clock signal in response to the impedance control command while the semiconductor device is in other than the self-refresh mode.

A29. The control method of the information processing system as any one of A26 to A28, the method further comprising:

issuing an external clock signal having a predetermined frequency from the controller to the semiconductor device; and setting the semiconductor device in first or second operation mode, wherein the controller, in the first operation mode, stops issuing the external clock signal or changes a frequency thereof while the semiconductor device is in the self-refresh mode, and the controller, in the second operation mode, continuously issues the external clock signal having the predetermined frequency without stopping the external clock signal even while the semiconductor device is in the self-refresh mode.

A30. The control method of the information processing system as anyone of A26 to A29, the method further comprising:

setting the semiconductor device in first or second operation mode;

issuing a first command from the controller to the semiconductor device that causes the semiconductor device to perform an access operation to the memory cell array; and issuing a second command from the controller to the semiconductor device that causes the semiconductor device to output the storage data through the data terminal, wherein the controller issues the second command or the impedance control command to the semiconductor device after elapse of a first period at earliest from issuing the self-refresh exit command in the first operation mode, the controller issues the second command or the impedance control command to the semiconductor device after elapse of a second period that is shorter than the first period at earliest from issuing the self-refresh exit command in the second operation mode, and the semiconductor device output the storage data through the data terminal to the controller in response to the second command.

A31. The control method of the information processing system as anyone of A26 to A30, the method further comprising:

setting the semiconductor device in first or second operation mode;

issuing a first command from the controller to the semiconductor device that causes the semiconductor device to perform an access operation to the memory cell array; and issuing a second command from the controller to the semiconductor device that causes the semiconductor device to output the storage data through the data terminal, wherein the controller issues the first command to the semiconductor device after elapse of a third period at earliest from issuing the self-refresh exit command in the first operation mode, the controller issues the first command to the semiconductor device after elapse of a fourth period that is shorter than the third period at earliest from issuing the self-refresh exit command in the second operation mode, and the semiconductor device performs the access operation to the memory cell array in response to the first command.

A32. The control method of the information processing system as any one of A26 to A30, the method further comprising:

issuing a power-down command from the controller to the semiconductor device that causes the semiconductor device to enter a power-down mode in which the semiconductor device reduces a power consumption thereof without performing the refresh operation;

issuing a power-down exit command from the controller to the semiconductor device that causes the semiconductor device to exit the power-down mode; and issuing a first command from the controller to the semiconductor device that causes the semiconductor device to perform an access operation to storage data in the memory cell array, wherein the controller issues the first command to the semiconductor device after elapse of a fifth period at earliest from issuing the power-down exit command, and the controller issues the first command to the semiconductor device after elapse of a sixth period that is substantially the same time length as the fifth period at earliest from issuing the self-refresh exit command.

A33. The control method of the information processing system as A32, wherein an interval of issuing the self-refresh commands is substantially the same as that of the auto-refresh commands.

A34. The control method of the information processing system as any one of A26 to A30, the method further comprising issuing an external clock signal having a predetermined frequency from the controller to the semiconductor device during the self-refresh mode, wherein the semiconductor device intermittently activates a first input buffer circuit supplied with the external clock signal and a DLL circuit that generates an internal clock signal based on an output signal of the first input buffer circuit in conjunction with each other while the semiconductor device is in the self-refresh mode.

A35. The control method of the information processing system as A34, wherein the semiconductor device intermittently activates the DLL circuit to update and retain information related to a delay amount of the DLL circuit.

A36. The control method of the information processing system as any one of A26 to A28, wherein the semiconductor device performs the refresh operation on n memory cells included in the memory cell array in response to the auto-refresh command, and the semiconductor device periodically performs the refresh operation on m memory cells included in the memory cell array while changing addresses for each first cycle during the self-refresh mode asynchronously with an external clock signal having a predetermined frequency, where m is smaller than n.

A37. The control method of the information processing system as A36, wherein the controller setting the semiconductor device to a first or second operation mode, the semiconductor device periodically performs the refresh operation on the n memory cells while changing addresses for each second cycle that is longer than the first cycle asynchronous with the external clock signal, in the first operation mode, and the semiconductor device periodically performs the refresh operation on the m memory cells while changing addresses for each first cycle asynchronous with the external clock signal, in the second operation mode.

A38. The control method of the information processing system as any one of A26 to A28, the method further comprising issuing an external clock signal having a predetermined frequency from the controller to the semiconductor device during the self-refresh mode, wherein the semiconductor device performs the refresh operation on n memory cells included in the memory cell array in a first period in response to the auto-refresh command, the semiconductor device performs the refresh operation on the n memory cells in the first period and enters the self-refresh mode in response to a self-refresh command, and the semiconductor device temporarily activates a DLL circuit that generates an internal clock signal that is phase-controlled based on the external clock signal to update and retain information related to a delay amount of the DLL circuit in connection with the self-refresh mode.

A39. The control method of the information processing system as any one of A26 to A28, wherein the semiconductor device temporarily activates a DLL circuit that generates an internal clock signal that is phase-controlled based on an external clock signal in response to the self-refresh command or the self-refresh exit command.

A40. The control method of the information processing system as A39, the method further comprising setting the semiconductor device in first or second operation mode, wherein the controller, in the first operation mode, does not issue the external clock signal to the semiconductor device during the self-refresh mode, the controller, in the second operation mode, issues the external clock signal to the semiconductor device during the self-refresh mode, the semiconductor device, in the first operation mode, repeatedly performs the refresh operation on n memory cells in a first period during the self-refresh mode, and the semiconductor device, in the second operation mode, performs the refresh operation once in response to the self refresh command.

A41. The control method of the information processing system as A40, wherein the semiconductor device, in the first operation mode, inactivating the DLL circuit during the self-refresh mode, and activating the DLL circuit in response to the self-refresh exit command with resetting the information, and the access control circuit, in the second operation mode, retaining the information without resetting in response to the self-refresh command, and activates the DLL circuit and updates the information in response to the self-refresh exit command.

A42. A semiconductor device comprising:
a first input buffer circuit to which an external clock signal having a predetermined frequency is supplied from outside;
a DLL circuit that generates an internal clock signal that is phase-controlled based on an output signal from the first input buffer circuit;

a memory cell array that has a plurality of memory cells requiring an refresh operation in order to retain of storage data therein;

an output buffer circuit that outputs the storage data read from the memory cell array to outside through a data terminal synchronously with the internal clock signal;

a second input buffer circuit supplied with an impedance control command from outside; and an access control circuit, wherein the access control circuit enters a self-refresh mode in which the refresh operation is performed in response to a self-refresh command, the access control circuit performs the refresh operation in response to an auto-refresh command, the access control circuit exits the self-refresh mode in response to a self-refresh exit command, and the access control circuit controls an impedance of the data terminal in response to the impedance control command during the self-refresh mode.

A43. The semiconductor device as A42, wherein the access control circuit controls an impedance of the data terminal asynchronously with the internal clock signal or the external clock signal when the impedance control command is issued while the semiconductor device is in the self-refresh mode.

A44. The semiconductor device as A42 or A43, wherein the access control circuit controls an impedance of the data terminal synchronously with the internal clock signal or the external clock signal when the impedance control command is issued while the semiconductor device is in other than the self-refresh mode.

A45. The semiconductor device as any one of A42 to A44, further comprising a latch circuit that latches an output signal of the second input buffer circuit synchronously with an output signal of the first input buffer circuit, wherein the latch circuit is bypassed during the self-refresh mode.

A46. The semiconductor device as A45, further comprising a switch circuit having a first input node supplied with an output signal of the latch circuit, a second input node supplied with the output signal of the second input buffer circuit, and output node connected to one of the first and second input nodes, wherein the output node is connected to the second input node during the self-refresh mode.

A47. The semiconductor device as A46, wherein the output node is connected to the first input node during other than the self-refresh mode.

A48. The semiconductor device as anyone of A42 or A47, wherein the access control circuit, in a first operation mode, inactivates the second input buffer circuit during the self-refresh mode, and the access control circuit, in a second operation mode, activates the second input buffer circuit during the self-refresh mode.

A49. The semiconductor device as A48, further comprising a latch circuit that latches an output signal of the second input buffer circuit synchronously with an output signal of the first input buffer circuit, wherein the latch circuit is bypassed during the self-refresh mode.

A50. The semiconductor device as any one of A42 to A49, wherein the access control circuit repeatedly performs the refresh operation asynchronously with the external clock signal during the self-refresh mode, and the access control circuit intermittently activates the first input buffer circuit and the DLL circuit in conjunction with each other during the self-refresh mode.

A51. The semiconductor device as any one of A42 to A50, wherein the access control circuit performs the refresh operation on n memory cells included in the memory cell array in response to the auto-refresh command, and the access control circuit periodically performs the refresh operation on m memory cells included in the memory cell array while changing addresses for each first cycle during the self-refresh mode, where m is smaller than n.

A52. The semiconductor device as any one of A42 to A49, wherein the access control circuit performs the refresh operation on n memory cells included in the memory cell array in a first period in response to the auto-refresh command, the access control circuit performs the refresh operation on the n memory cells in the first period and enters the self-refresh mode in response to a self-refresh command, and the access control circuit temporarily activates the DLL circuit to update and retain information related to a delay amount of the DLL circuit in connection with the self-refresh mode.

A53. The semiconductor device as any one of A42 to A49, wherein the access control circuit inactivates the first input buffer circuit while the semiconductor device is in the self-refresh mode.

A54. The semiconductor device as A53, wherein the access control circuit activates the second input buffer circuit whether the semiconductor device is in the self-refresh mode or not.

A55. The semiconductor device as A48 or A49, wherein the semiconductor device is set to the first or second operation mode according to a mode-register set command supplied from outside.

A56. The semiconductor device as A48 or A49, wherein the semiconductor device is set to the first or second operation mode according to an additional signal supplied from outside along with the self-refresh command.

What is claimed is:

1. A method for controlling termination impedance of a data terminal in a dynamic random access memory device, said method comprising:

receiving a mode register set command to set an operation mode to a first mode;

setting the operation mode in a mode register to the first mode;

receiving a self-refresh entry command;

entering self-refresh mode;

wherein the self-refresh entry command is received through a command terminal and a clock enable terminal;

activating a first input buffer connected to a termination impedance control terminal; and receiving an impedance control signal at the first input buffer, wherein the termination impedance of the data terminal is set to a first impedance value if the termination impedance control signal has a first level and the termination impedance of the data terminal is set to a second impedance value if the termination impedance control signal has a second level.

2. The method as claimed in claim 1 wherein the second impedance value is off.

3. The method as claimed in claim 2 wherein the first impedance value is in a range of 30Ω to 120Ω.

4. The method as claimed in claim 1 wherein the first level is a high level and the second level is a low level.

5. The method as claimed in claim 1 wherein the operation mode is received through an address terminal.

6. The method as claimed in claim 1 wherein the mode register set command and the self-refresh entry command are received synchronously with a clock signal received by a clock input buffer connected to a clock terminal.

7. The method as claimed in claim 6 wherein the clock input buffer is deactivated after entering self-refresh mode.

8. The method as claimed in claim 1 further comprising:

receiving a self-refresh exit command;

exiting self-refresh mode;

receiving a mode register set command indicative of a second operation mode;

setting the operation mode in a mode register to the second mode;

receiving a self-refresh entry command;

entering self-refresh mode; and deactivating the first input buffer, wherein the termination impedance of the data terminal is set to off.

9. The method as claimed in claim 8 wherein the self-refresh exit command is received through a clock enable terminal.

* * * * *